United States Patent
Xu et al.

(10) Patent No.: US 12,125,537 B2
(45) Date of Patent: Oct. 22, 2024

(54) VARIABLE PROGRAMMING VOLTAGE STEP SIZE CONTROL DURING PROGRAMMING OF A MEMORY DEVICE

(71) Applicant: SanDisk Technologies LLC, Addison, TX (US)

(72) Inventors: Huiwen Xu, Cupertino, CA (US); Jun Wan, San Jose, CA (US); Bo Lei, San Jose, CA (US)

(73) Assignee: SanDisk Technologies LLC

( * ) Notice: Subject to any disclaimer, the term of this patent is extended or adjusted under 35 U.S.C. 154(b) by 120 days.

(21) Appl. No.: 17/502,398

(22) Filed: Oct. 15, 2021

(65) Prior Publication Data

US 2023/0124371 A1    Apr. 20, 2023

(51) Int. Cl.
G11C 16/04    (2006.01)
G11C 11/56    (2006.01)
G11C 16/10    (2006.01)

(52) U.S. Cl.
CPC .......... *G11C 16/10* (2013.01); *G11C 11/5628* (2013.01); *G11C 11/5671* (2013.01); *G11C 16/0483* (2013.01)

(58) Field of Classification Search
CPC . G11C 16/10; G11C 11/5628; G11C 11/5671; G11C 16/0483
USPC .................................................. 365/185.03
See application file for complete search history.

(56) References Cited

U.S. PATENT DOCUMENTS

| | | | |
|---|---|---|---|
| 7,450,426 B2 | 11/2008 | Li et al. | |
| 7,596,031 B2 | 9/2009 | Hemink et al. | |
| 8,908,441 B1 | 12/2014 | Dutta et al. | |
| 9,548,124 B1* | 1/2017 | Hazeghi | G11C 7/14 |
| 10,014,063 B2* | 7/2018 | Tseng | G11C 16/10 |
| 10,748,622 B2 | 8/2020 | Lin et al. | |
| 2021/0082510 A1 | 3/2021 | Yamada et al. | |

OTHER PUBLICATIONS

Zhichao Du et al., Adaptive Pulse Programming Scheme for Improving the Vth Distribution and Program Performance in 3D NAND Flash Memory, Journal of the Electron Devices Society, Jan. 28, 2021, pp. 102-107, vol. 9, 2021.

* cited by examiner

Primary Examiner — Tha-O H Bui
(74) Attorney, Agent, or Firm — Dickinson Wright PLLC; Steven C. Hurles

(57) ABSTRACT

The memory device includes a control circuitry that is communicatively coupled to memory cells are arranged in a plurality of word lines. The control circuitry is configured to perform a first programming pass on a selected word line. The first programming pass includes a plurality of programming loops, each of which includes the application of a programming pulse (Vpgm). The programming pulse voltage is increased between programming loops of the first programming pass by a step size. The step size is a first step size between two programming loops of the first programming pass and is a second step size that is different than the first step size between two other programming loops of the first programming pass. The control circuitry is also configured to perform a second programming pass to further program the memory cells of the selected word line to the plurality of data states.

20 Claims, 22 Drawing Sheets

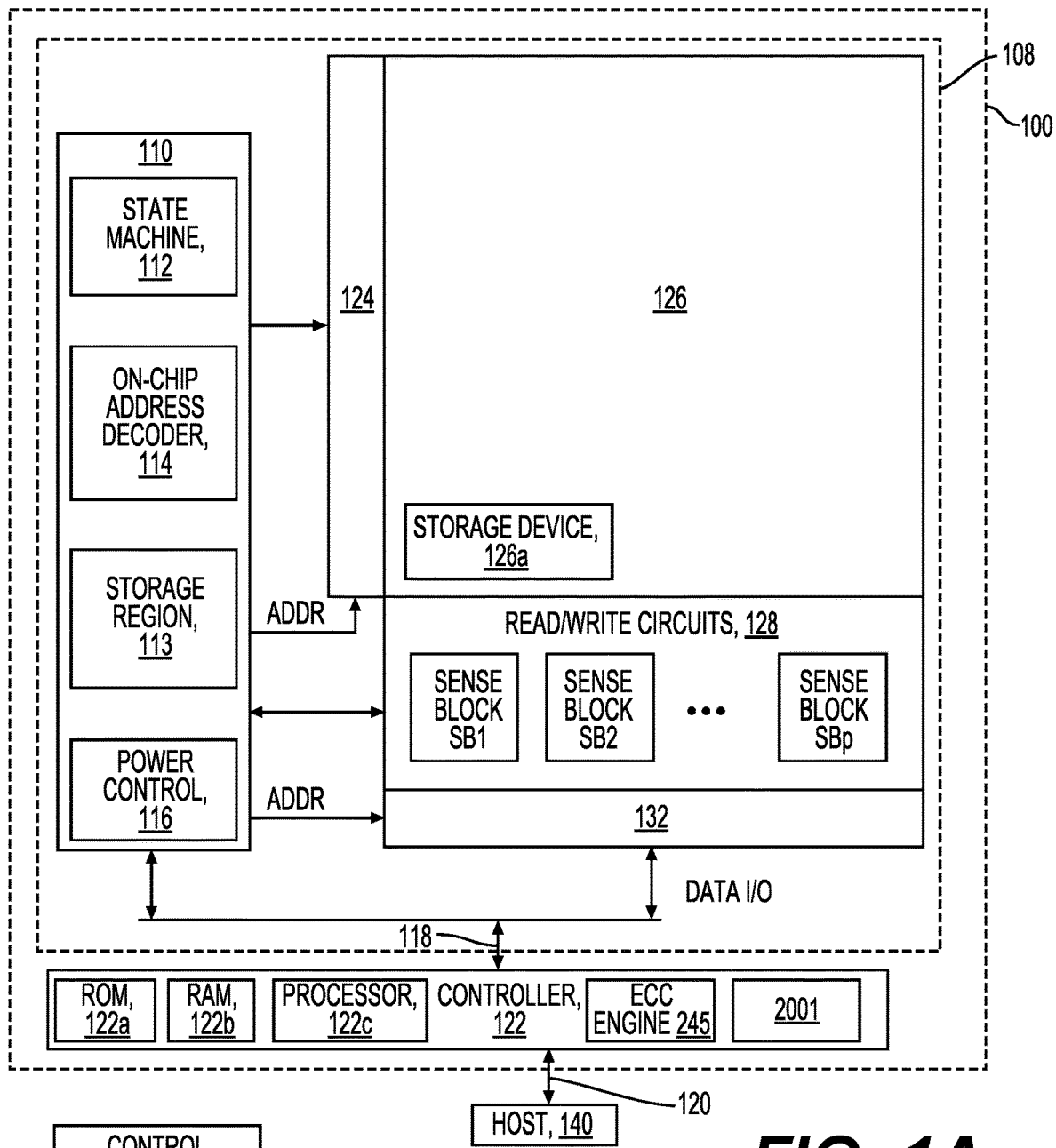
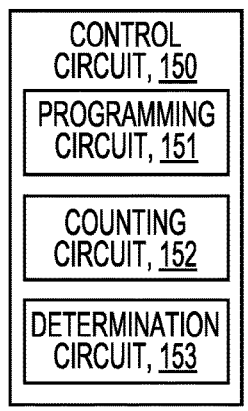
FIG. 1A
- *Prior Art* -
FIG. 1B
- *Prior Art* -

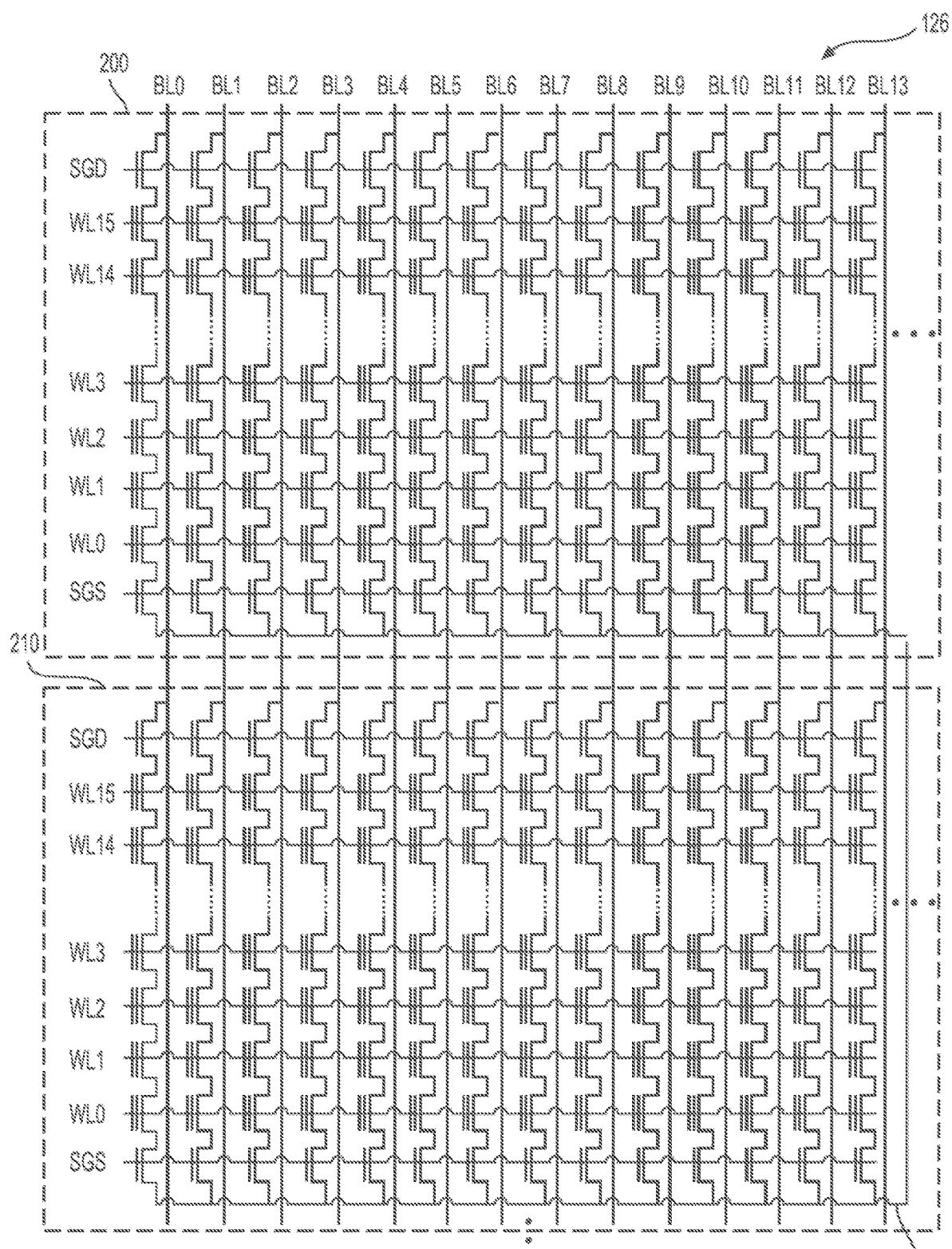
FIG. 2 - Prior Art

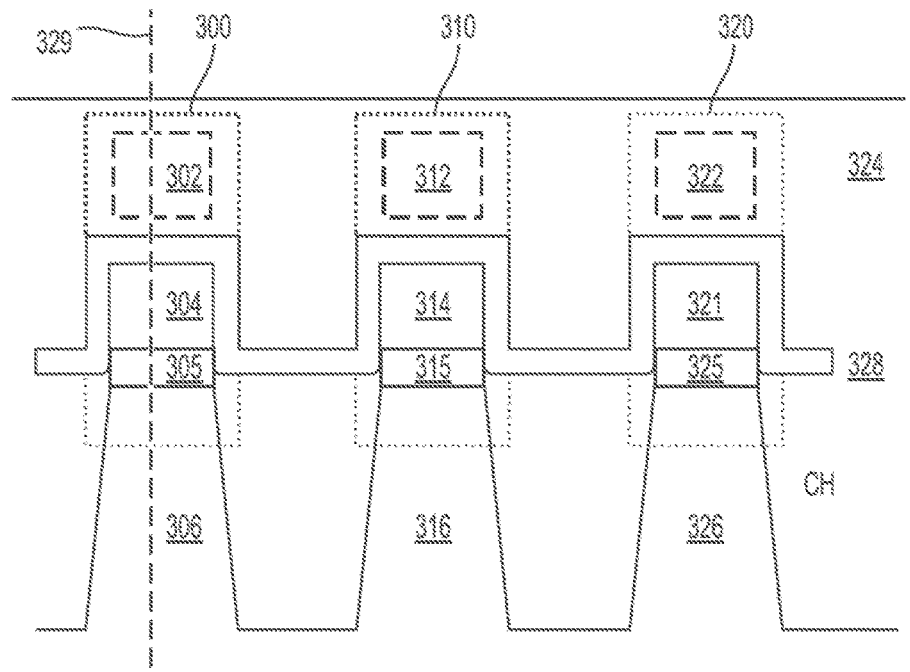
FIG. 3A - Prior Art
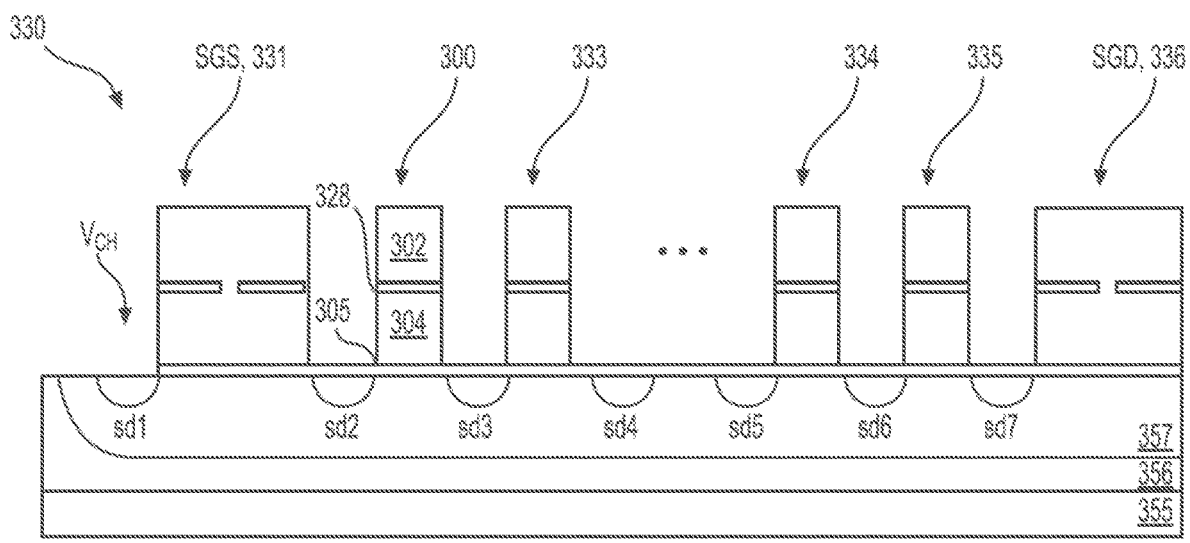
FIG. 3B - Prior Art

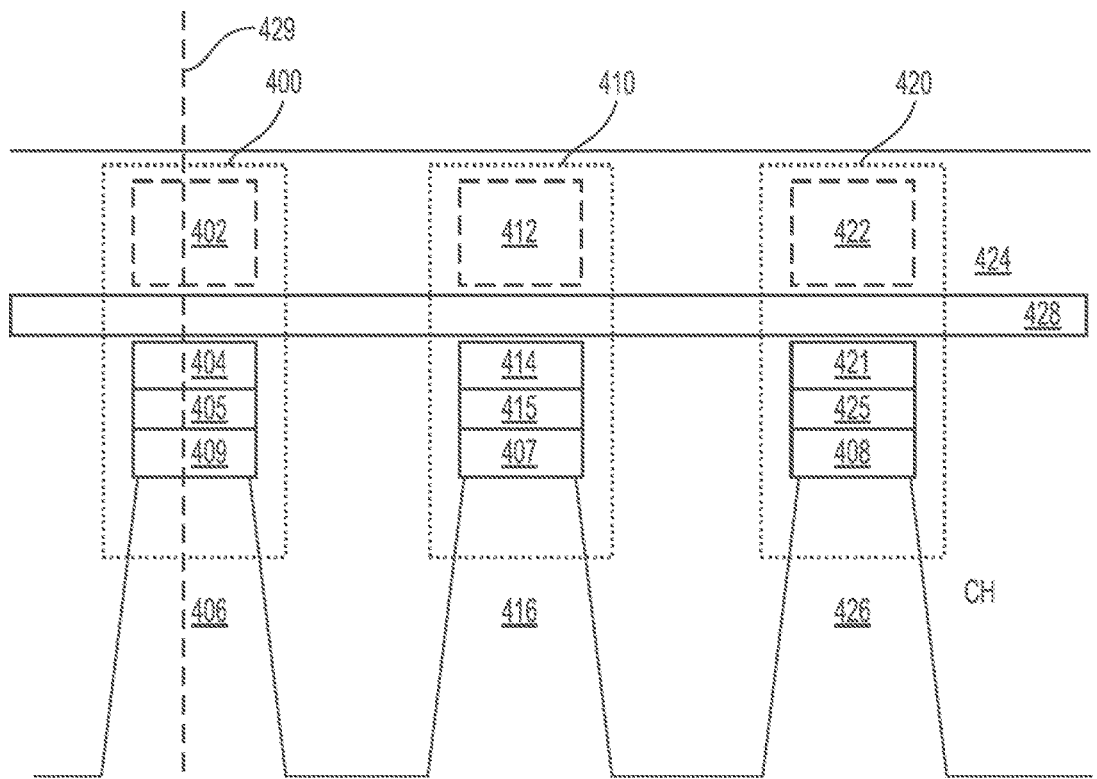
*FIG. 4A - Prior Art*
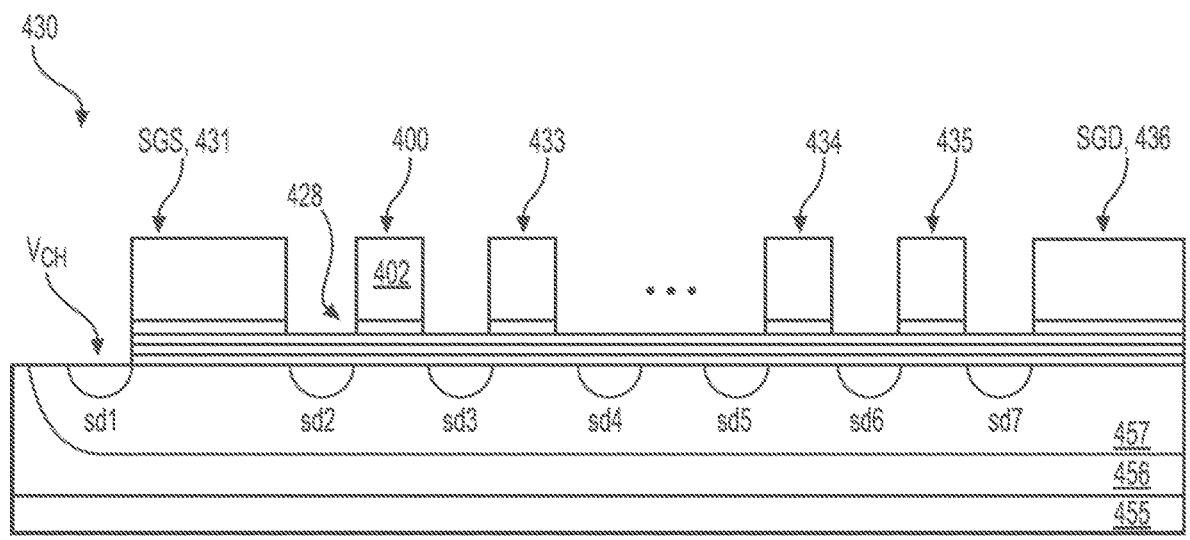
*FIG. 4B - Prior Art*

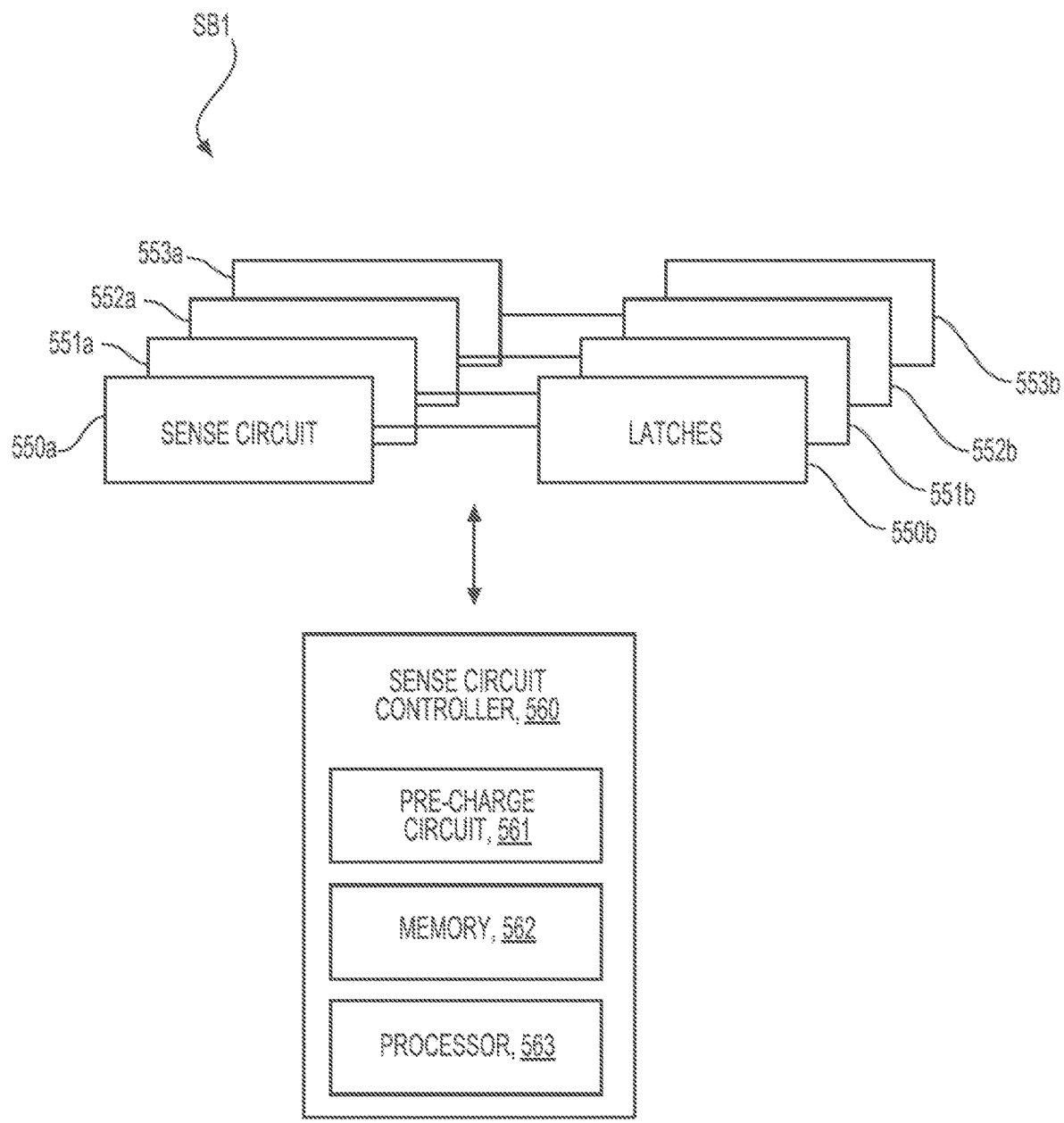
FIG. 5 - Prior Art

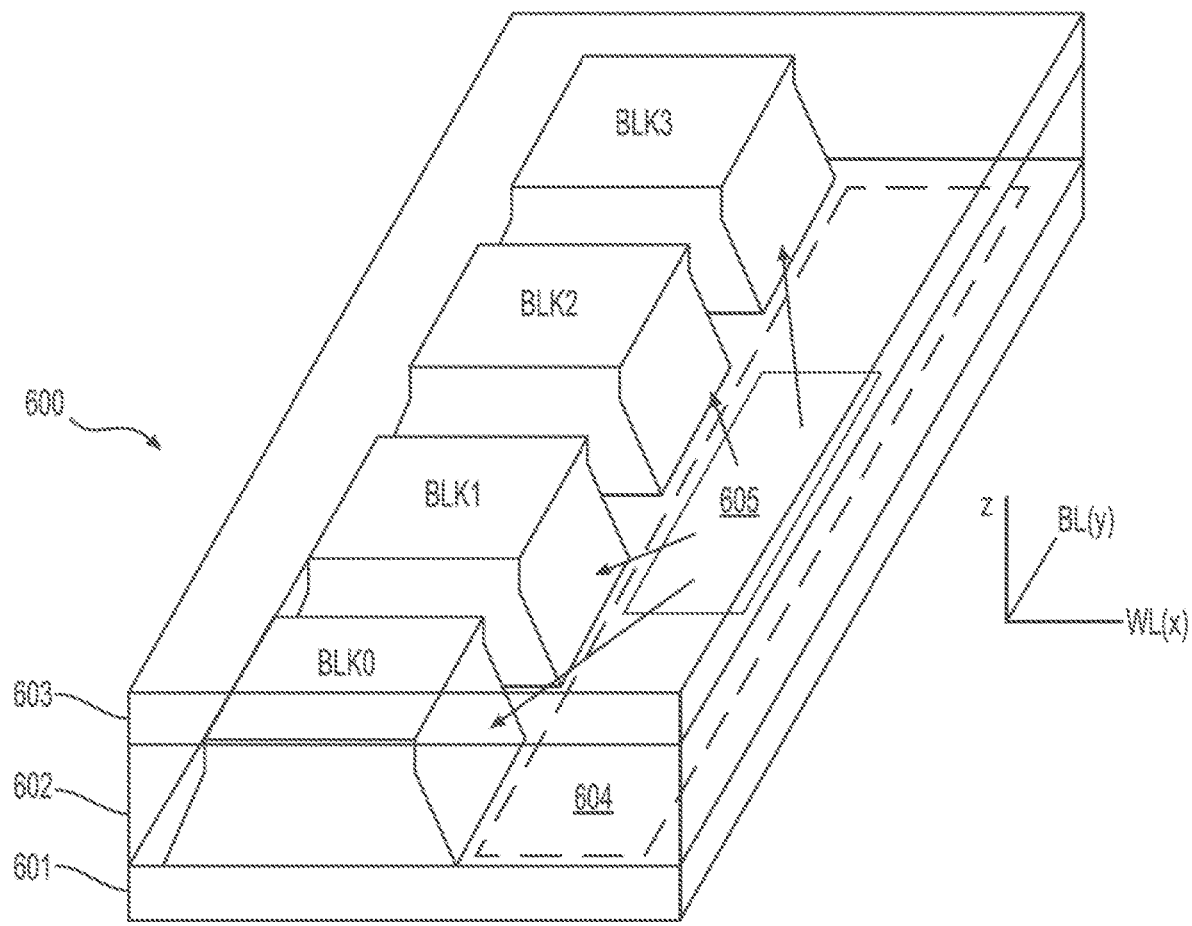
FIG. 6A - Prior Art

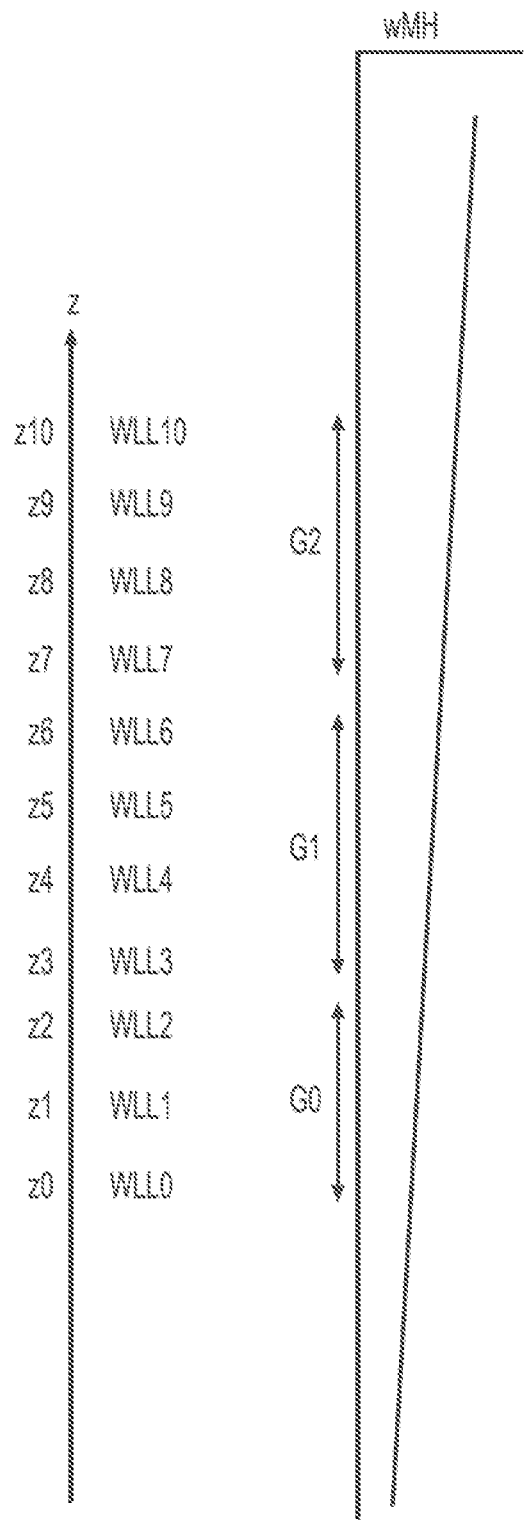
FIG. 6C - Prior Art

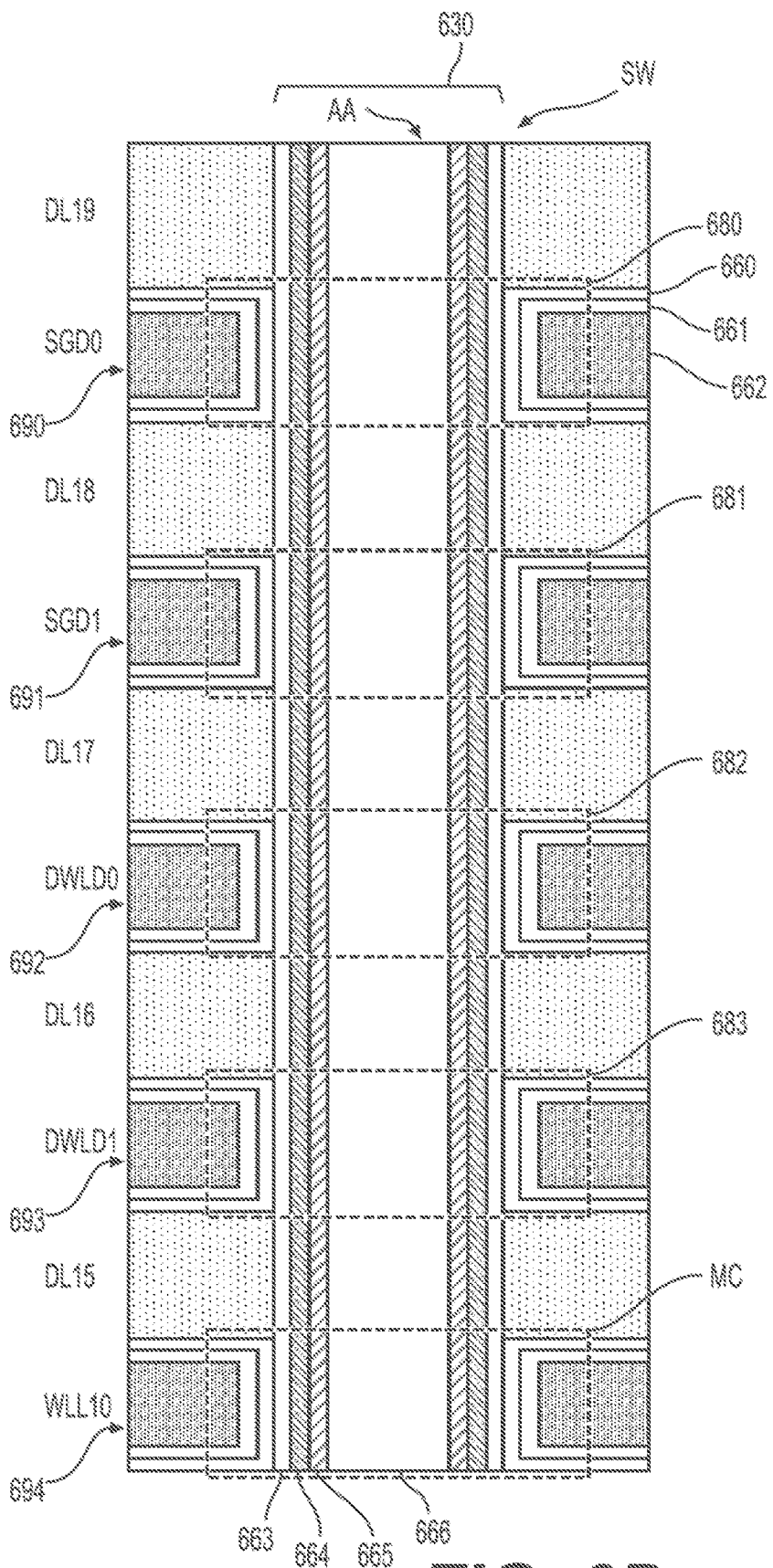
FIG. 6D - Prior Art

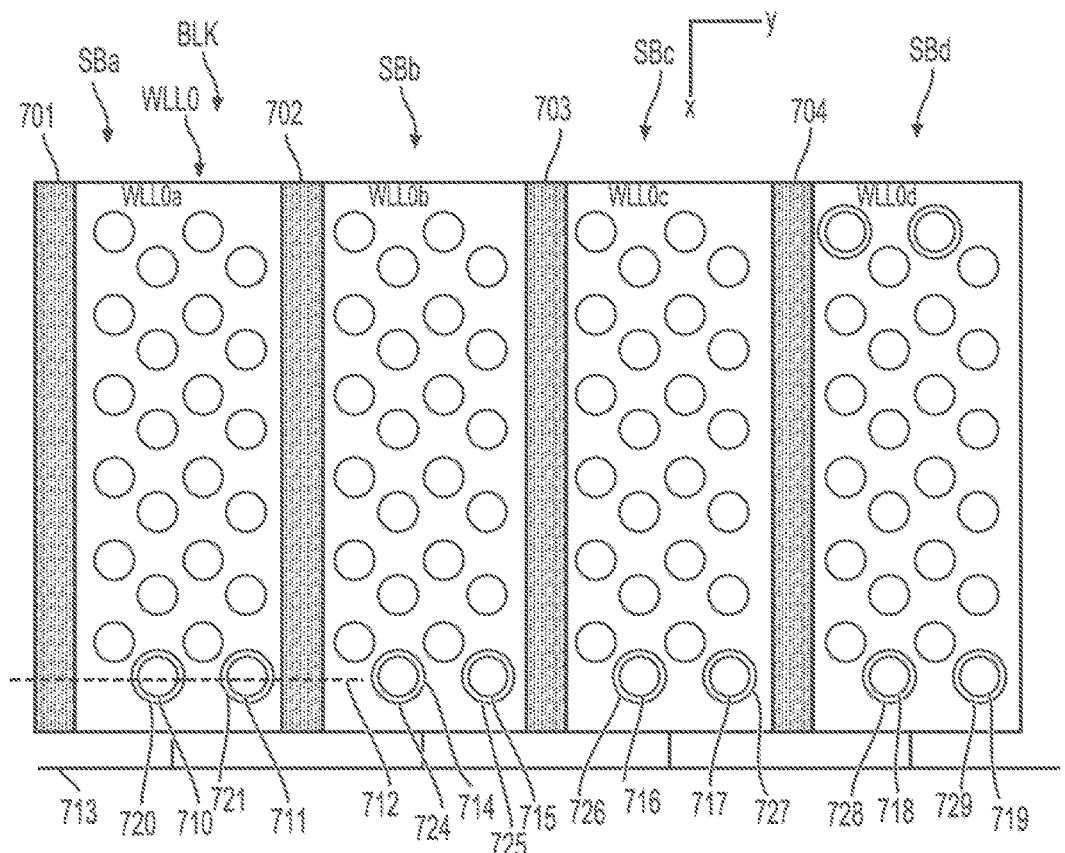
FIG. 7A - Prior Art
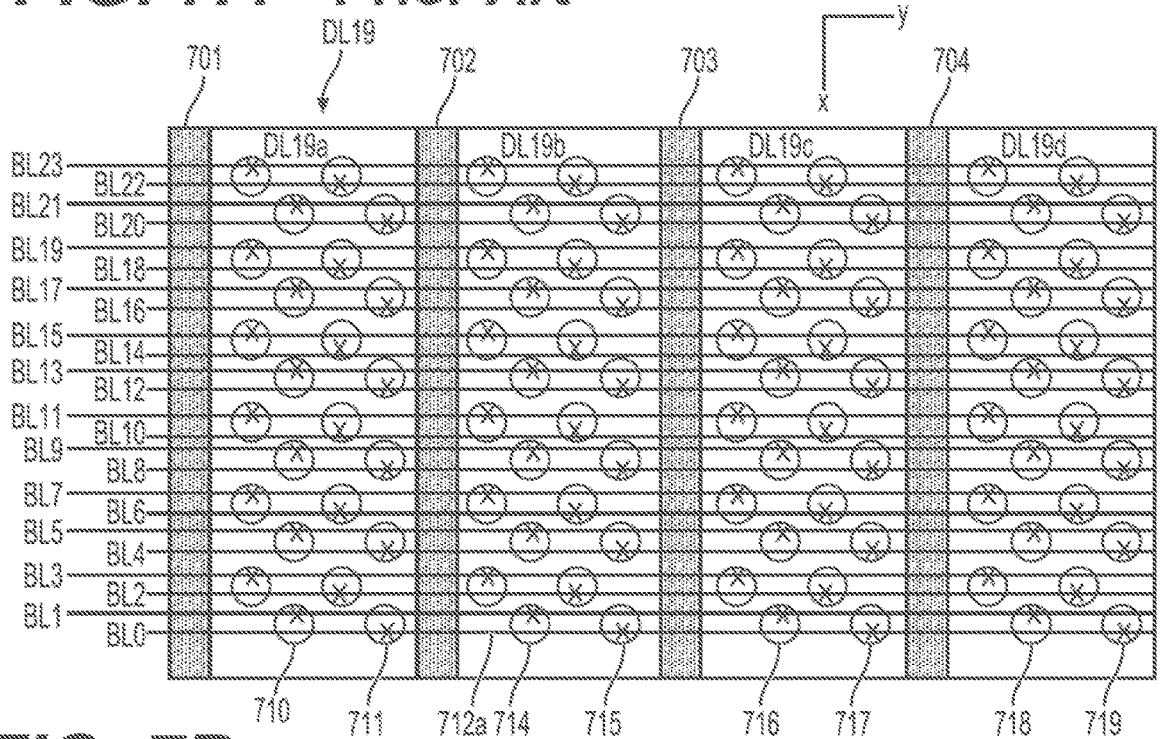
FIG. 7B - Prior Art

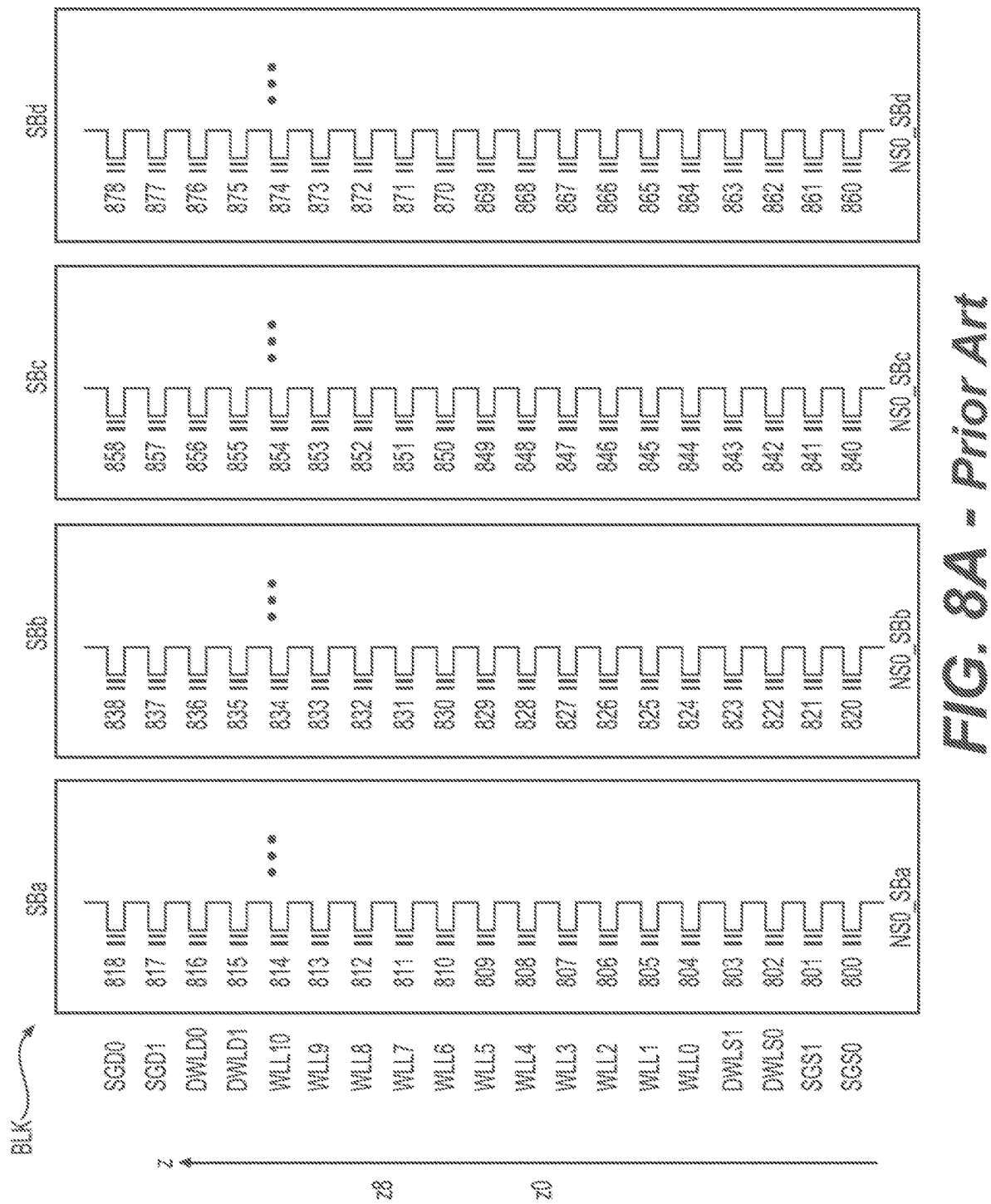
FIG. 8A - Prior Art

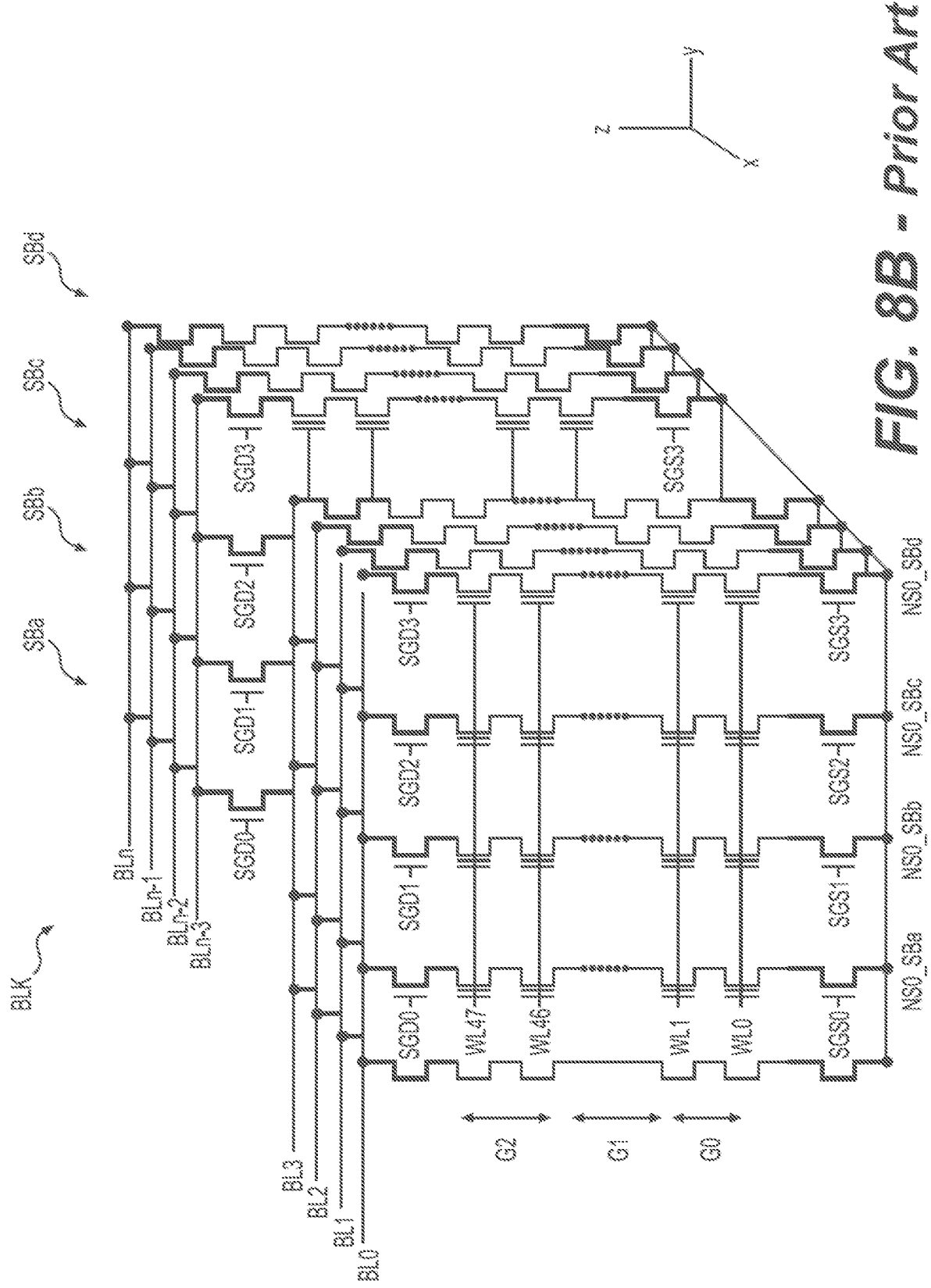
FIG. 8B - Prior Art

FIG. 16

| STATE | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| S1  | 1 |   |   |   |   |   |   |   |   |   |   |   |   |   |   |   |   |   |
| S2  |   | 1 | 1 |   |   |   |   |   |   |   |   |   |   |   |   |   |   |   |
| S3  |   |   | 1 | 1 | 1 |   |   |   |   |   |   |   |   |   |   |   |   |   |
| S4  |   |   |   | 1 | 1 | 1 |   |   |   |   |   |   |   |   |   |   |   |   |
| S5  |   |   |   |   | 1 | 1 | 1 |   |   |   |   |   |   |   |   |   |   |   |
| S6  |   |   |   |   |   | 1 | 1 | 1 |   |   |   |   |   |   |   |   |   |   |
| S7  |   |   |   |   |   |   | 1 | 1 | 1 |   |   |   |   |   |   |   |   |   |
| S8  |   |   |   |   |   |   |   | 1 | 1 | 1  |    |    |    |    |    |    |    |    |
| S9  |   |   |   |   |   |   |   |   | 1 | 1  | 1  |    |    |    |    |    |    |    |
| S10 |   |   |   |   |   |   |   |   |   | 1  | 1  | 1  |    |    |    |    |    |    |
| S11 |   |   |   |   |   |   |   |   |   |    | 1  | 1  | 1  |    |    |    |    |    |
| S12 |   |   |   |   |   |   |   |   |   |    |    | 1  | 1  | 1  | 1  |    |    |    |
| S13 |   |   |   |   |   |   |   |   |   |    |    |    | 1  | 1  | 1  | 1  |    |    |
| S14 |   |   |   |   |   |   |   |   |   |    |    |    |    | 1  | 1  | 1  | 1  |    |
| S15 |   |   |   |   |   |   |   |   |   |    |    |    |    |    |    |    |    | 1  |

FIG. 17

| STATE | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| S1  | 1 |   |   |   |   |   |   |   |   |   |   |   |   |   |   |   |   |   |
| S2  |   | 1 | 1 |   |   |   |   |   |   |   |   |   |   |   |   |   |   |   |
| S3  |   |   |   |   |   |   |   |   |   |   |   |   |   |   |   |   |   |   |
| S4  |   |   |   | 1 | 1 | 1 |   |   |   |   |   |   |   |   |   |   |   |   |
| S5  |   |   |   |   |   |   |   |   |   |   |   |   |   |   |   |   |   |   |
| S6  |   |   |   |   |   |   |   |   |   |   |   |   |   |   |   |   |   |   |
| S7  |   |   |   |   |   |   | 1 | 1 |   |   |   |   |   |   |   |   |   |   |
| S8  |   |   |   |   |   |   |   | 1 | 1 | 1  |    |    |    |    |    |    |    |    |
| S9  |   |   |   |   |   |   |   |   |   |    |    |    |    |    |    |    |    |    |
| S10 |   |   |   |   |   |   |   |   |   |    |    |    |    |    |    |    |    |    |
| S11 |   |   |   |   |   |   |   |   |   |    | 1  | 1  | 1  |    |    |    |    |    |
| S12 |   |   |   |   |   |   |   |   |   |    |    |    | 1  | 1  | 1  |    |    |    |
| S13 |   |   |   |   |   |   |   |   |   |    |    |    |    |    |    |    |    |    |
| S14 |   |   |   |   |   |   |   |   |   |    |    |    |    |    |    |    |    |    |
| S15 |   |   |   |   |   |   |   |   |   |    |    |    |    |    |    |    |    |    |

| STATE | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| S1 | 1 | | | | | | | | | | | | | | | | | |
| S2 | | 1 | | | | | | | | | | | | | | | | |
| S3 | | 1 | 1 | | | | | | | | | | | | | | | |
| S4 | | | 1 | 1 | | | | | | | | | | | | | | |
| S5 | | | 1 | 1 | 1 | | | | | | | | | | | | | |
| S6 | | | | 1 | 1 | 1 | | | | | | | | | | | | |
| S7 | | | | | 1 | 1 | 1 | | | | | | | | | | | |
| S8 | | | | | | 1 | 1 | 1 | | | | | | | | | | |
| S9 | | | | | | | 1 | 1 | 1 | | | | | | | | | |
| S10 | | | | | | | | 1 | 1 | 1 | | | | | | | | |
| S11 | | | | | | | | | 1 | 1 | 1 | | | | | | | |
| S12 | | | | | | | | | | 1 | 1 | 1 | | | | | | |
| S13 | | | | | | | | | | | 1 | 1 | 1 | 1 | 1 | | | |
| S14 | | | | | | | | | | | | | 1 | 1 | 1 | 1 | 1 | |
| S15 | | | | | | | | | | | | | | 1 | 1 | 1 | 1 | 1 |

*FIG. 19*

VARIABLE PROGRAMMING VOLTAGE STEP SIZE CONTROL DURING PROGRAMMING OF A MEMORY DEVICE

BACKGROUND

1. Field

The present technology relates to the operation of memory devices.

2. Related Art

Many memory devices are provided as internal, semiconductor, integrated circuits in computers or other electronic devices. There are many different types of memory, including random-access memory (RAM), read only memory (ROM), dynamic random-access memory (DRAM), synchronous dynamic random-access memory (SDRAM), an electrically erasable programmable read-only memory (EEPROM), a flash memory, and/or the like. In an EEPROM or flash NAND array architecture, memory cells may be arranged in a matrix of rows and columns such that gates of each memory cell are coupled by rows to word lines. The memory cells may be arranged together in a plurality of word lines.

The memory cells are often programmed to a plurality of data states in multiple programming passes, each of which includes a plurality of programming loops with programming and verify pulses. These programming passes each take a considerable amount of time, and there is a continuing need to improve performance by reducing the time required to perform either or both of the programming pulses.

SUMMARY

An aspect of the present disclosure is related to a storage device that includes a non-volatile memory. A control circuitry that is communicatively coupled to an array of memory cells that are arranged in a plurality of word lines and that are configured to be programmed to a plurality of data states. The control circuitry is configured to perform a first programming pass on a selected word line of the plurality of word lines. The first programming pass includes a plurality of programming loops. Each programming loop includes the application of a programming pulse (Vpgm) to a control gate of the selected word line. The control circuitry is further configured to increase a voltage of the programming pulse (Vpgm) between programming loops of the first programming pass by a step size, and the step size is a first step size between two programming loops of the first programming pass and is a second step size that is different than the first step size between two other programming loops of the first programming pass. The control circuitry is also configured to perform a second programming pass on the selected word line to further program the memory cells of the selected word line to the plurality of data states.

According to another aspect of the present disclosure, the step size is dependent on at least one data state that is to be programmed during the subsequent programming loop.

According to yet another aspect of the present disclosure, the step size is the first step size prior to the completion of programming of a threshold data state of the plurality of data states and is the second step size after the completion of programming of the threshold data state.

According to still another aspect of the present disclosure, the plurality of data states includes fifteen programmed data states.

According to a further aspect of the present disclosure, during the first programming pass, verify is conducted during some of the programming loops and verify is skipped during some of the programming loops.

According to yet a further aspect of the present disclosure, the step size is dependent on which data state of the plurality of data states is to be programmed during the subsequent programming loop and wherein the step size is determined as a function of a gap between a verify level of the data state being programmed during the subsequent programming loop and a second pass verify level of the same data state to be applied during the second programming pass.

According to still a further aspect of the present disclosure, the step size is dependent on which data state of the plurality of data states is to be programmed during the subsequent programming loop and wherein the step size is determined as a function of a fine verify level gap for the data state to be programmed during the subsequent programming loop.

According to another aspect of the present disclosure, the step size is dependent on which data state of the plurality of data states is to be programmed during the subsequent programming loop and wherein the step size is determined as a function of a programming voltage step size that is employed during the second programming pass.

Another aspect of the present disclosure is related to a method of programming a memory device. The method includes the step of preparing a memory device that includes an array of memory cells arranged in a plurality of words lines. The memory cells are configured to be programmed to a plurality of data states. The method further includes performing a first programming pass on a selected word line of the plurality of word lines. The first programming pass includes a plurality of programming loops. Each programming loop includes the application of a programming pulse (Vpgm) to a control gate of the selected word line. The method proceeds with increasing a voltage of the programming pulse (Vpgm) between programming loops of the first programming pass by a step size. The step size is a first step size between two programming loops of the first programming pass and is a second step size that is different than the first step size between two other programming loops of the first programming pass. The method continues with the step of performing a second programming pass on the selected word line to further program the memory cells of the selected word line to the plurality of data states.

According to another aspect of the present disclosure, the step size is dependent on at least one data state that is to be programmed during the subsequent programming loop.

According to yet another aspect of the present disclosure, the step size is the first step size prior to the completion of programming of a threshold data state of the plurality of data states and is the second step size after the completion of programming of the threshold data state.

According to still another aspect of the present disclosure, the plurality of data states includes fifteen programmed data states.

According to a further aspect of the present disclosure, during the first programming pass, verify is conducted during some of the programming loops and verify is skipped during some of the programming loops.

According to yet a further aspect of the present disclosure, the step size is dependent on which data state of the plurality of data states is to be programmed during the subsequent programming loop, and the step size is determined as a function of a gap between a verify level of the data state being programmed during the subsequent programming loop and a second pass verify level of the same data state to be applied during the second programming pass.

According to still a further aspect of the present disclosure, the step size is dependent on which data state of the plurality of data states is to be programmed during the subsequent programming loop and wherein the step size is determined as a function of a fine verify level gap for the data state to be programmed during the subsequent programming loop.

According to another aspect of the present disclosure, the step size is dependent on which data state of the plurality of data states is to be programmed during the subsequent programming loop, and the step size is determined as a function of a programming voltage step size that is employed during the second programming pass.

Yet another aspect of the present disclosure is related to an apparatus that includes a memory device. The memory device includes an array of memory cells that are arranged in a plurality of word lines and a programming means that is in electrical communication with the array of memory cells for programming the memory cells to a plurality of data states. The programming means is configured to perform a first programming pass on a selected word line of the plurality of word lines. The first programming pass includes a plurality of programming loops, and each programming loop includes the application of a programming pulse (Vpgm) to a control gate of the selected word line. The programming means is further configured to increase a voltage of the programming pulse (Vpgm) between programming loops of the first programming pass by a step size. The step size is a first step size between two programming loops of the first programming pass and is a second step size that is different than the first step size between two other programming loops of the first programming pass. The programming means is still further configured to perform a second programming pass on the selected word line to further program the memory cells of the selected word line to the plurality of data states.

According to another aspect of the present disclosure, the step size is dependent on at least one data state that is to be programmed during the subsequent programming loop.

According to yet another aspect of the present disclosure, the step size is the first step size prior to the completion of programming of a threshold data state of the plurality of data states and is the second step size after the completion of programming of the threshold data state.

According to still another aspect of the present disclosure, the plurality of data states includes fifteen programmed data states.

BRIEF DESCRIPTION OF THE DRAWINGS

In the following description of the enabling embodiments, reference will be made to the accompanying drawings in which:

FIG. 1A is a block diagram of an example memory device;

FIG. 1B is a block diagram of an example control circuit;

FIG. 2 depicts blocks of memory cells in an example two-dimensional configuration of the memory array of FIG. 1A;

FIG. 3A and FIG. 3B depict cross-sectional views of example floating gate memory cells in NAND strings;

FIG. 4A and FIG. 4B depict cross-sectional views of example charge-trapping memory cells in NAND strings;

FIG. 5 depicts an example block diagram of the sense block SB1 of FIG. 1;

FIG. 6A is a perspective view of a set of blocks in an example three-dimensional configuration of the memory array of FIG. 1;

FIG. 6C depicts a plot of memory hole diameter in the stack of FIG. 6B;

FIG. 6D depicts a close-up view of region 722 of the stack of FIG. 6B;

FIG. 7A depicts a top view of an example word line layer WLL0 of the stack of FIG. 6B;

FIG. 7B depicts a top view of an example top dielectric layer DL19 of the stack of FIG. 6B;

FIG. 8A depicts example NAND strings in the sub-blocks SBa-SBd of FIG. 7A;

FIG. 8B depicts another example view of NAND strings in sub-blocks;

FIG. 16 is a table identifying which programming loops which verify pulses are performed in during a programming operation according to one exemplary embodiment;

FIG. 17 is a table identifying which programming loops which verify pulses are performed in during a programming operation according to another exemplary embodiment;

FIG. 19 is a table identifying which programming loops which verify pulses are performed in during a programming operation according to yet another exemplary embodiment and identifying the point where a programming pulse step size changes.

DETAILED DESCRIPTION

Figure 6B:
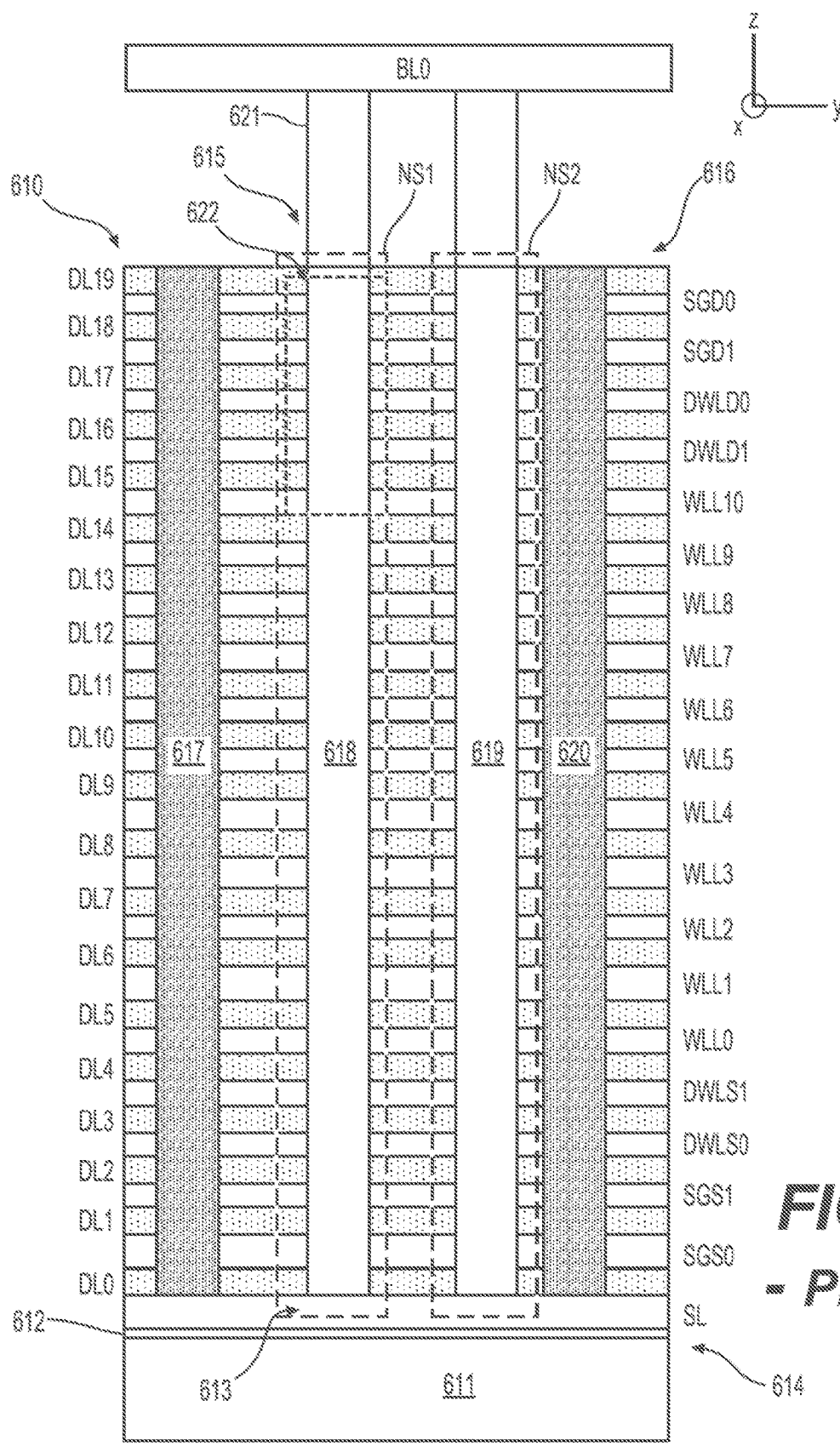
FIG. 6B depicts an example cross-sectional view of a portion of one of the blocks of FIG. 6A.

Techniques are provided for programming a memory device to in a multi-pass programming operation to improve programming time tProg without overprogramming or otherwise increasing the final threshold voltage margin.

As discussed in further detail below, to accomplish these objectives, during a first (foggy) programming pass of the multi-pass programming operation, a step size (dVpgm- _Foggy) that a programming voltage is increased between programming loops is data state dependent, i.e., not fixed. More specifically, dVpgm_Foggy is controlled by at least one of a fine level verify gap between two adjacent data states and a verify level gap between the verify levels of the same data state during the first and second passes. These techniques may be applied to the first pass of a range of different types of multi-pass programming operations without overprogramming or otherwise increasing the final threshold voltage margin of any programmed data state as compared to using a fixed step size throughout the first programming pass.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labeled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

FIG. 7A illustrates a top view of an example word line layer WLL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WLL0a, WLL0b, WLL0c and WLL0d which are each connected by a contact line 713. The last region of a word line layer in a block can be connected to a first region of a word line layer in a next block, in one approach. The contact line 713, in turn, is connected to a voltage driver for the word line layer. The region WLL0a has example memory holes 710, 711 along a contact line 712. The region WLL0b has example memory holes 714, 715. The region WLL0c has example memory holes 716, 717. The region WLL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 820, 821 are in WLL0a, memory cells 824, 825 are in WLL0b, memory cells 826, 827 are in WLL0c, and memory cells 828, 829 are in WLL0d. These memory cells are at a common height in the stack.

Contact line connectors (e.g., slits, such as metal-filled slits) 801, 802, 803, 804 may be located between and adjacent to the edges of the regions WLL0a-WLL0d. The contact line connectors 801, 802, 803, 804 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 8B illustrates a top view of an example top dielectric layer DL19 of the stack of FIG. 7B. The dielectric layer is divided into regions DL19a, DL19b, DL19c and DL19d.

Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL19a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL19 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 10:
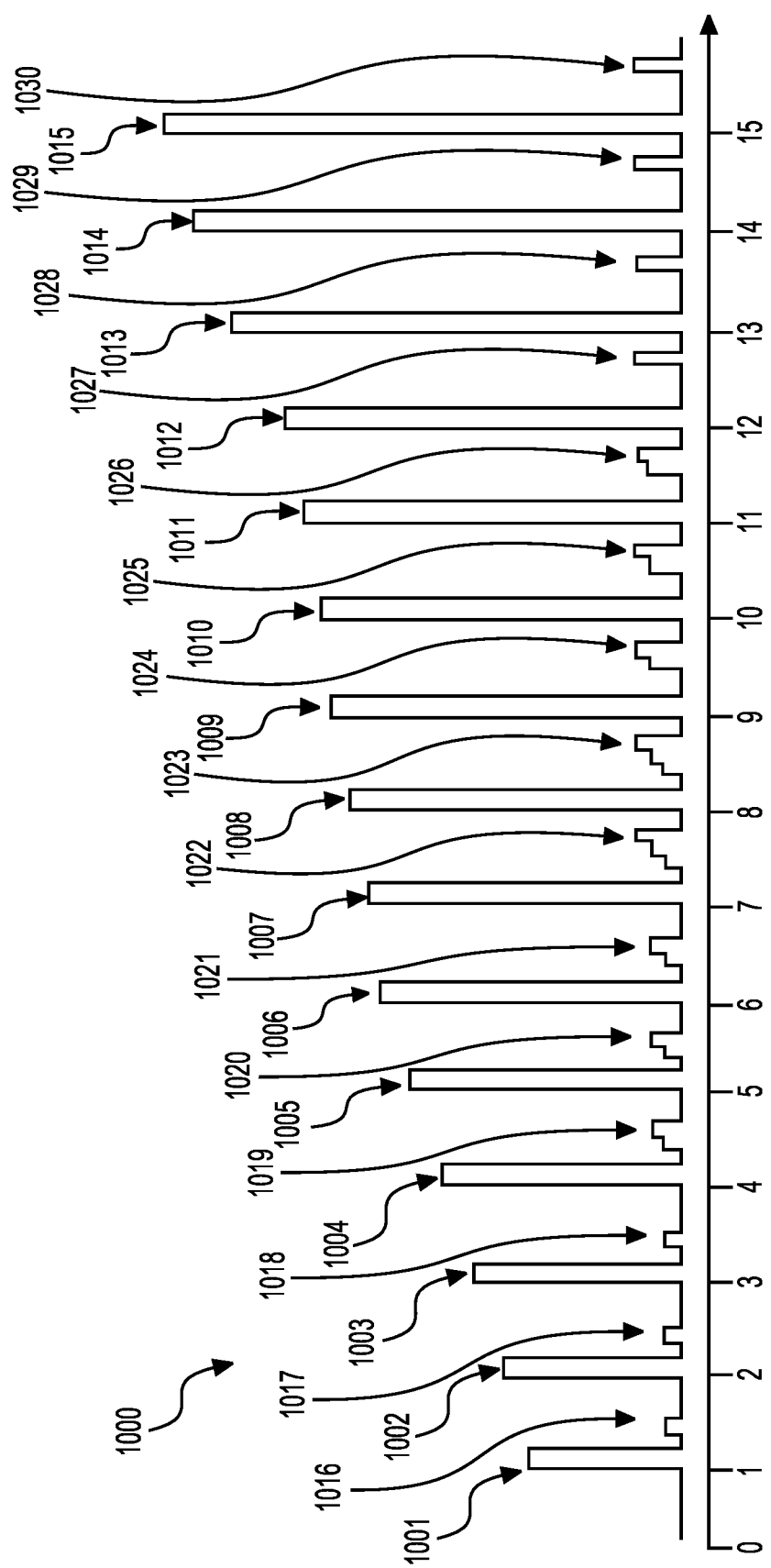
FIG. 10 depicts a waveform of an example memory cell programming operation.

FIG. 10 depicts a waveform 1000 of an example memory cell programming operation that could be employed for either or both of the passes of a multi-pass operation (discussed below). The horizontal axis depicts time, and the vertical axis depicts control gate or word line voltage. Generally, a programming operation can involve applying a pulse train to a selected word line, where the pulse train includes multiple program loops or program-verify iterations. Each program loop includes a programming Vpgm pulse and one or more verify pulses, depending on which data states are being programmed in a particular program loop. A square waveform is depicted for each pulse for simplicity; however, other shapes are possible, such as a multilevel shape or a ramped shape. Further, Incremental Step Pulse Programming (ISPP) is used in this example, in which the Vpgm pulse amplitude is increased by a step size (dVpgm) in each successive program loop. As discussed in further detail below, according to the programming techniques discussed herein, the step size (dVpgm) is dependent on the data state being programmed in the next successive programming loop, i.e., dVpgm is not fixed. This example uses ISPP in a single programming pass in which the programming is completed. ISPP can also be used in either or both programming passes of a multi-pass operation.

Figure 9:
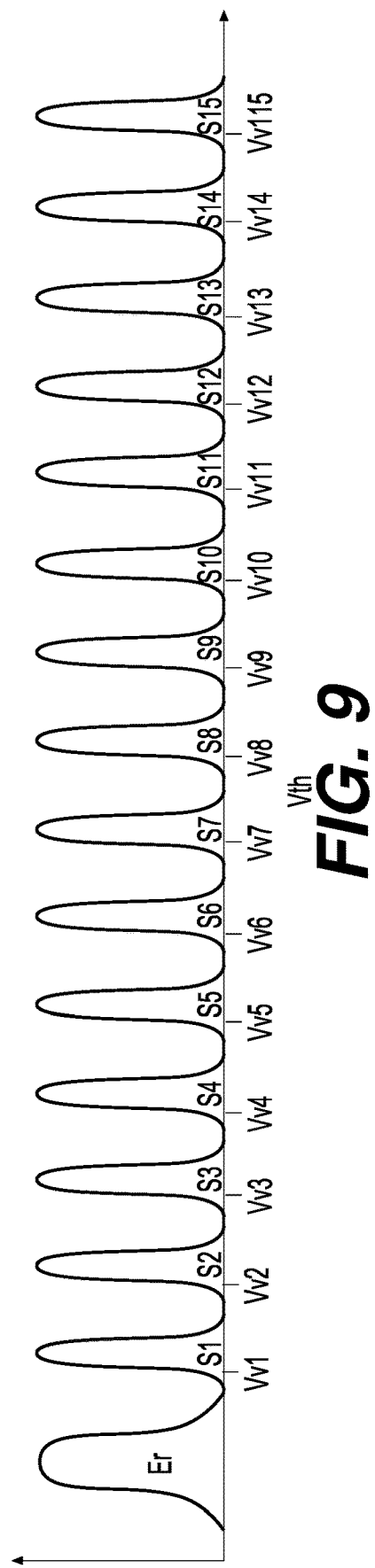
FIG. 9 illustrates the Vth distributions of the data states in a QLC memory system.

The pulse train includes Vpgm pulses that increase stepwise in amplitude with each program loop using a step size (dVpgm). A new pulse train starts at an initial Vpgm pulse level and ends at a final Vpgm pulse level which does not exceed a maximum allowed level. The pulse train 1000 includes a series of Vpgm pulses 1001-1015 that are applied to a selected word line that includes a set of non-volatile memory cells. One or more verify voltage pulses 1016-1029 are provided after each Vpgm pulse as an example, based on the target data states which are being verified. The verify voltages correspond with the voltages Vv1-Vv15 (shown in FIG. 9) depending on the particular data states that are being programmed in a given program loop or may be reduced by an offset, as discussed in further detail below. Reducing the number of programming loops and/or the number of Vpgm or verify pulses in either programming pass of a multi-pass programming operation will improve (reduce) programming time tProg correspondingly, thereby improving the performance of the memory device.

The verify voltages are used to determine if a memory cell has completed programming. A sensing operation can determine whether a memory cell has a Vth above the associated verify voltage by applying sensing a current through the memory cell while the verify voltage is applied to the control gate of the selected word line containing the memory cell. If the current is relatively high, this indicates that the memory cell is in a conductive state such that the Vth is less than the very voltage. If the current is relatively low, this indicates that the memory cell is in a non-conductive state such that the Vth is above the control gate voltage. Once a memory cell has completed programming, it is locked out or inhibited from further programming.

Figure 11:
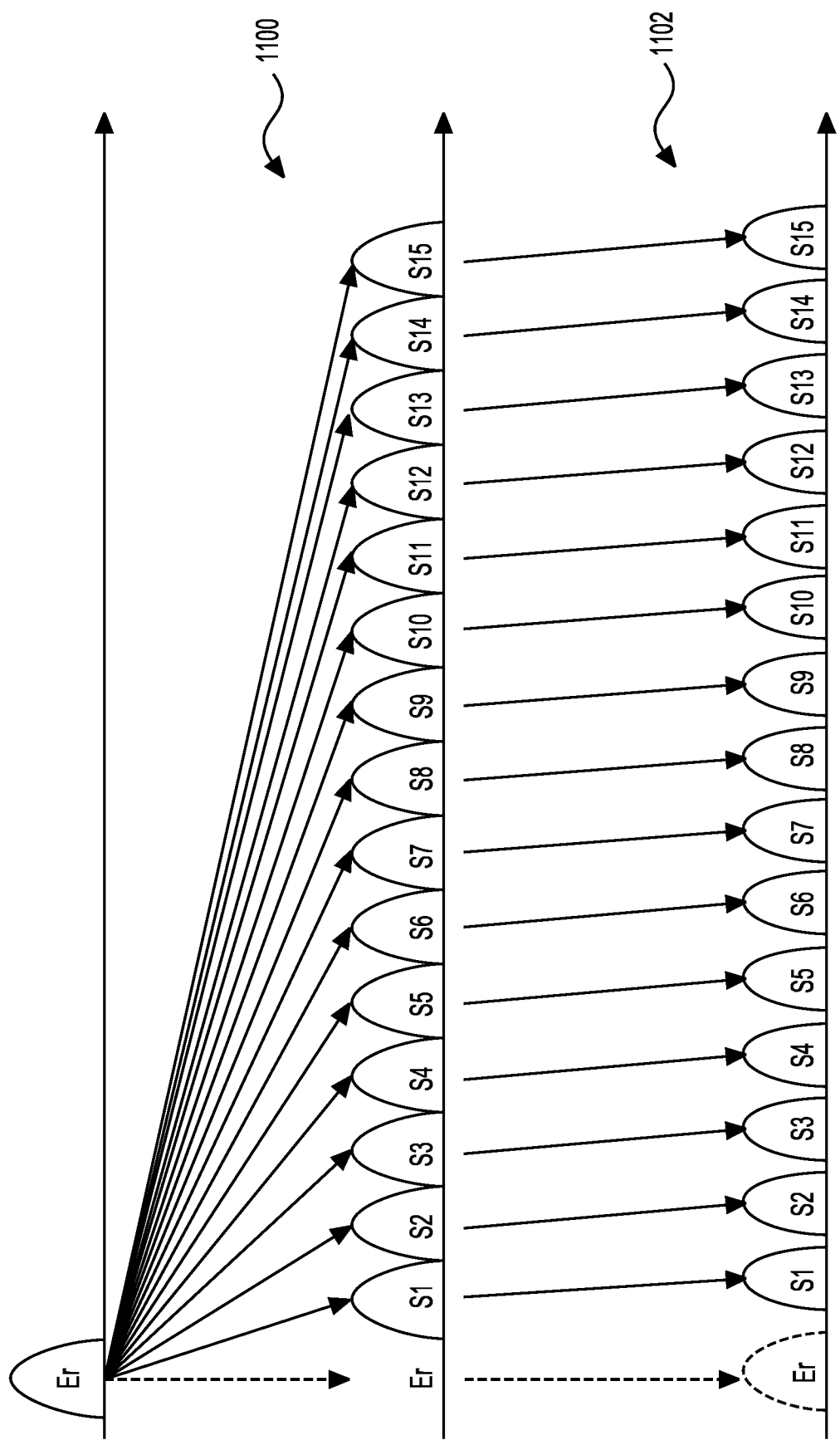
FIG. 11 illustrates the Vth distributions of the data states of memory cells during a first exemplary embodiment of a two-pass programming technique.

The programming operation may be a multi-pass programming operation in which the memory cells are programmed to their final programmed data states in two or more programming passes, which are sometimes called a "foggy pass" and a "fine pass." A first example of a multi-pass programming operation to program the memory cells to four bits of data per memory cell (QLC) is a full-sequence foggy-fine programming operation depicted in FIG. 11. In the first (foggy) pass 1100, the memory cells are programmed quickly to approximately all of data states S1-S15, but each data state has a large or "fat" threshold voltage distribution. In the second (fine) pass 1102, the memory cells are programmed more slowly and with higher accuracy to tighten the threshold voltage distributions.

Figure 12:
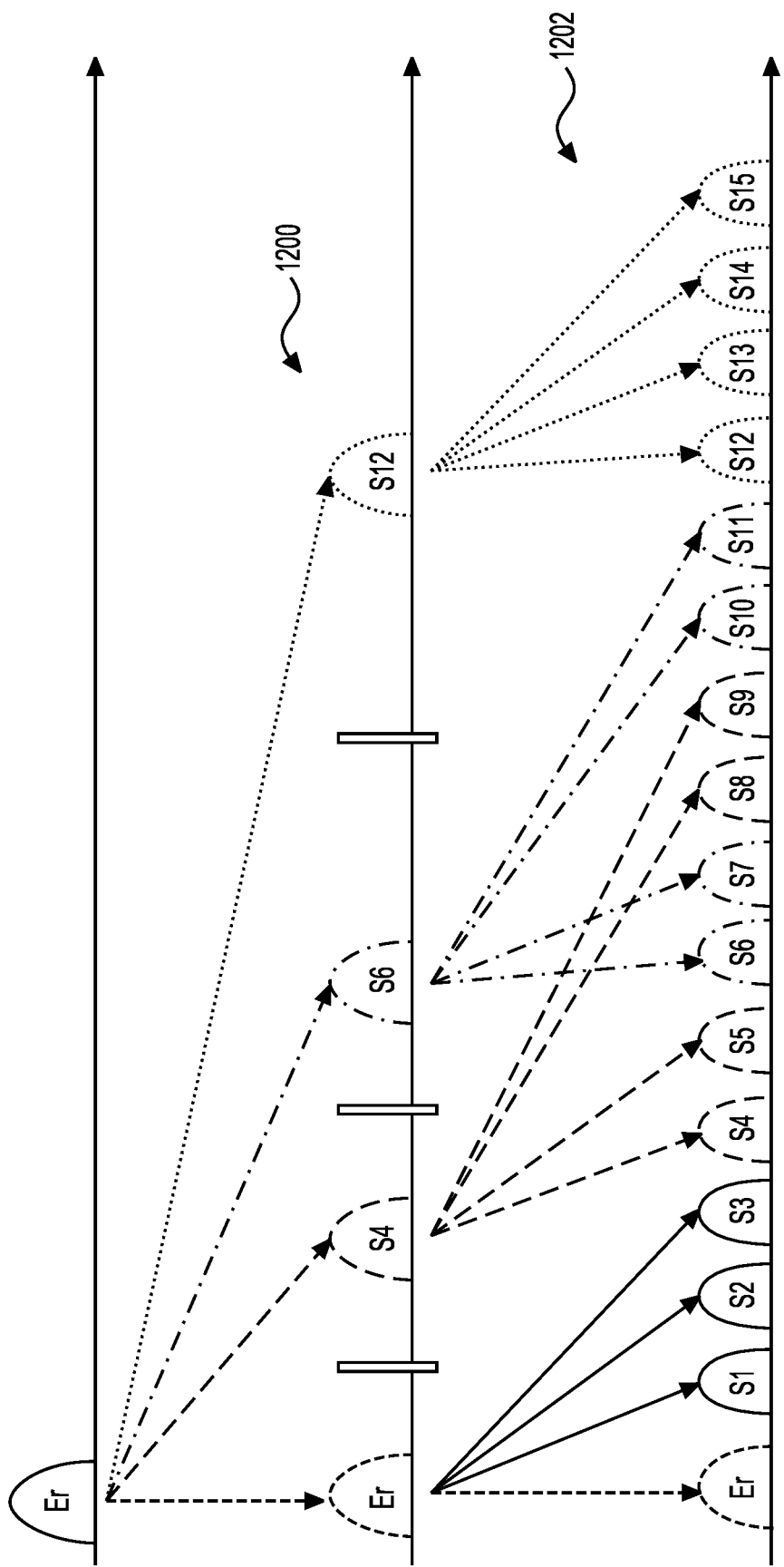
FIG. 12 illustrates the Vth distributions of the data states of memory cells during a second exemplary embodiment of a two-pass programming technique.

A second example of a multi-pass programming operation is depicted in FIG. 12. In the first (foggy) pass 1200, rather than programming the memory cells of the word line to all of the programmed data states S1-S15, the memory cells are either left in the erase Er data state or are programmed to one of the S4, S6, and S12 data states. A relatively large voltage step size (dVpgm—discussed in further detail below) may be used in the first pass to reduce programming time. In the second (fine) pass 1202, the memory cells in the Er state are either left in the Er state or are programmed to the S1, S2, or S3 data states; the memory cells in the S4 data state are either left in the S4 data state or programmed to the S5, S10, or S11 data states; the memory cells in the S6 data state are either left in the S6 data state or programmed to the S7, S10, or S11 data states; and the memory cells of the S12 data state are either left in the S12 data state or are programmed to the S13, S14, or S15 data states.

Figure 13:
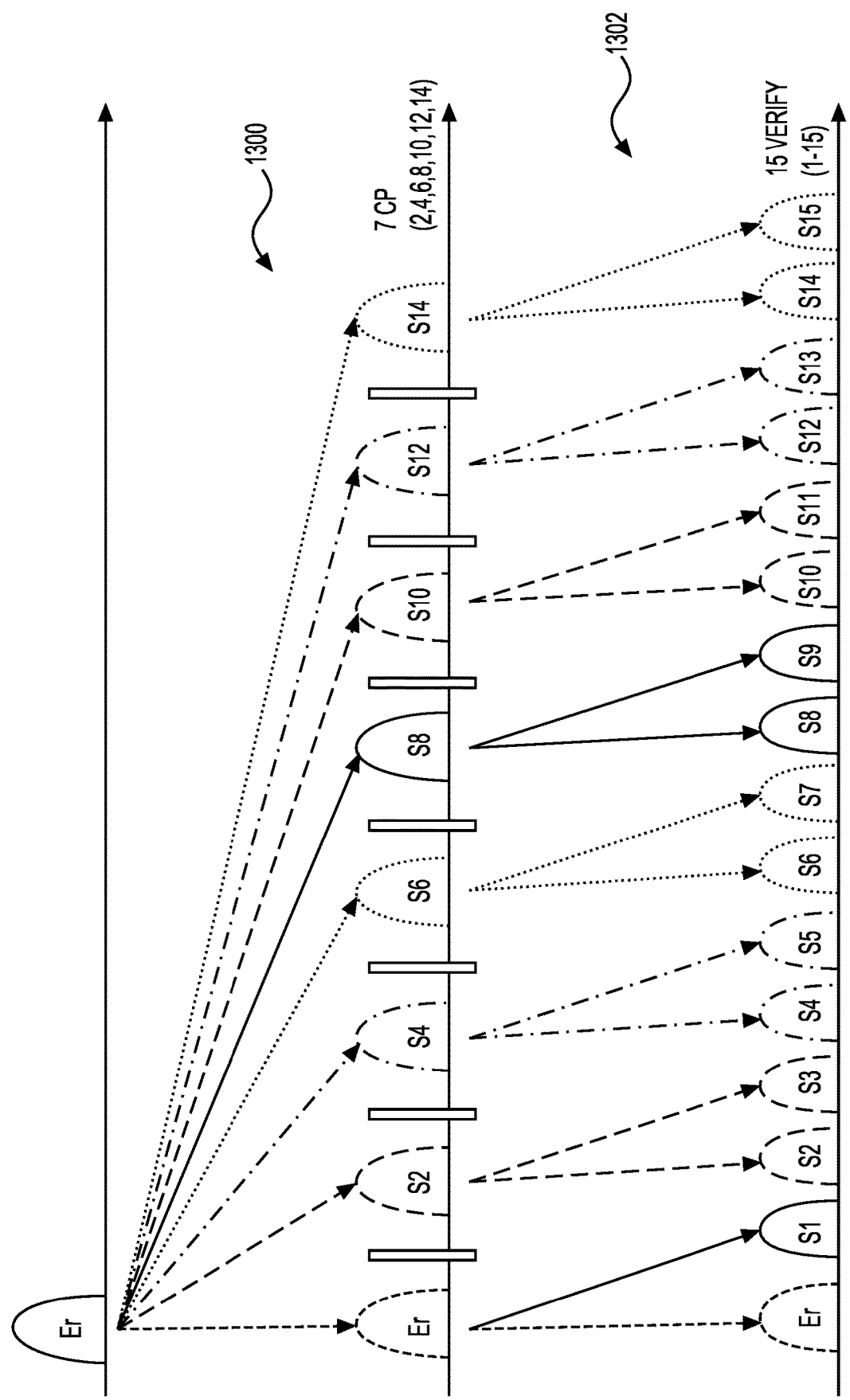
FIG. 13 illustrates the Vth distributions of the data states of memory cells during a third exemplary embodiment of a two-pass programming technique.

A third example of a multi-pass programming operation is depicted in FIG. 13. This example is similar to the one depicted in FIG. 12 and discussed above, but in the first (foggy) pass 1300, the memory cells are either left in the erase data state Er or are programmed to any of the S2, S4, S6, S8, S10, S12, and S14 data states. In the second (fine) pass 1302, the memory cells of the Er data state are either left in the Er data state or are programmed to the S1 data state; the memory cells of the S2 data state are either programmed to the final S2 data state or are programmed to the S3 data state; the memory cells of the S4 data state are either programmed to the final S4 data state or are programmed to the S5 data state; etc.

Figure 14:
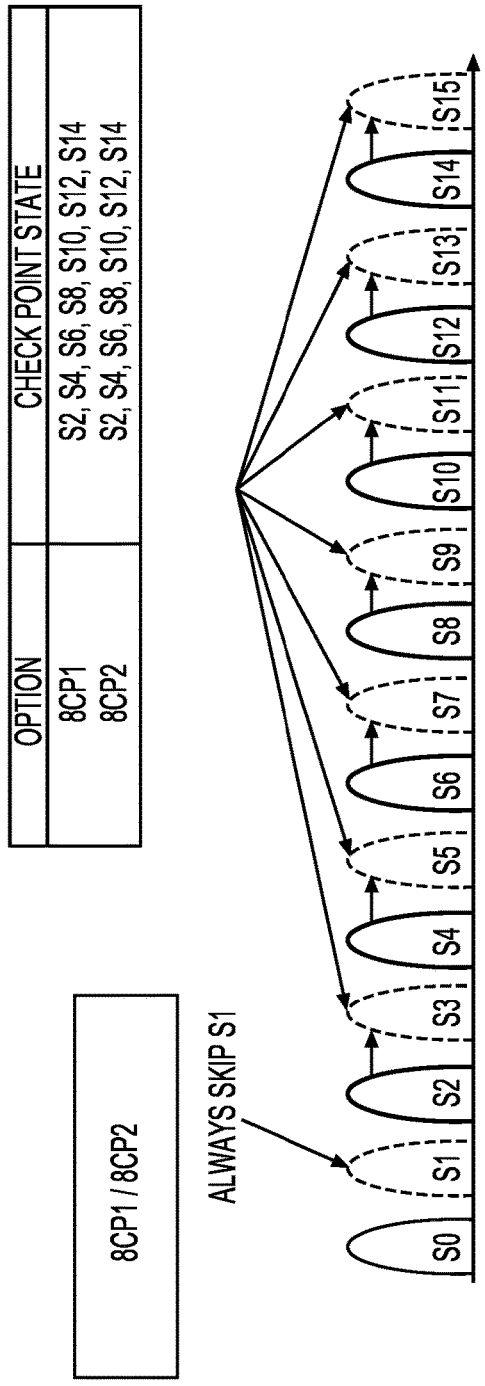
FIG. 14 illustrates the Vth distributions of the data states of memory cells during a fourth exemplary embodiment of a two-pass programming technique.
Figure 15:
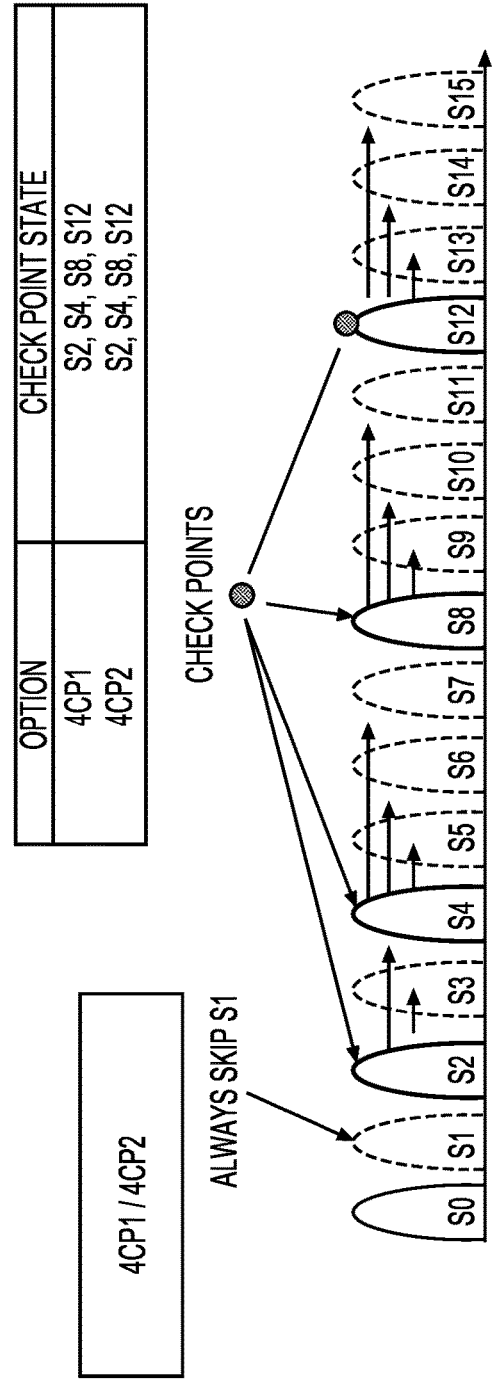
FIG. 15 illustrates the Vth distributions of the data states of memory cells during a fifth exemplary embodiment of a two-pass programming technique.

In yet another embodiment, programming performance during the first (foggy) programming pass is improved by programming the memory cells of a selected word line to all of the programmed data states S1-S15 (similar to full-sequence foggy-fine discussed above and depicted in FIG. 11), but the verify pulses are skipped during the programming of some, but not all, of the data states. For example, in the foggy programming scheme depicted in FIG. 14, verify is only performed during programming of data states S2, S4, S6, S8, S10, S12, and S14, and verify is skipped during programming of data states S1, S3, S5, S7, S9, S11, S13, and S15. In the example depicted in FIG. 15, verify is only performed during programming of data states S2, S4, S8, and S12, and verify is skipped during the programming of data states S1, S3, S5, S6, S7, S9, S10, S11, S13, S14, and S15. By skipping so many verify pulses in either case, the programming time tProg during the first (foggy) programming pass is dramatically improved, i.e., reduced. All of the programmed data states (S1-S15) are verified during the second (fine) programming pass.

FIG. 16 illustrates a table where the rows identify the states being programmed and verified, and the columns identify the number of programming loops during the first (foggy) programming pass and with the "1 s" identifying which programming loops which verify pulses are applied in. For example, the verify pulse Vvs2_Foggy is applied in each of the first, second, and third programming loops to verify the S2 data state; the verify pulse Vs3_Foggy is applied in the second, third, fourth, and fifth programming loops; etc. In this example, a total of sixty (60) verify pulses are applied to the selected word line to complete the first (foggy) programming pass. In contrast, FIG. 17 shows a table where the first (foggy) programming pass discussed above is employed to skip the verify pulses for the S3, S5, S6, S7, S9, S10, All, S13, S14, and S15 data states. In this embodiment, only a total of sixteen (16) verify pulses are applied to the selected word line to complete the first (foggy) programming pass. Thus, because it involves significantly fewer verify pulses, the first (foggy) programming pass of FIG. 17 has significantly lower tProg than that of FIG. 16.

One problem with skipping verify pulses during the first (foggy) programming pass is that, in some cases, skipping verify can result in overprogramming of some memory cells (specifically, the memory cells of the data states that are not verified), and this overprogramming cannot be undone during the second (fine) programming pass. Two parameters that can be adjusted to control overprogramming are the programming voltage step size (dVpgm_Foggy) during the first (foggy) pass and the programming voltage step size (dVpgm_Fine) during the second (fine) programming pass.

According to the programming techniques discussed herein, programming performance during the first (foggy) programming pass is improved by making a programming voltage step size (dVpgm_Foggy) be dependent on the data state being programmed. More specifically, the dVpgm_Foggy applied during the first (foggy) programming pass is kept at a reduced level (e.g., dVpgm_Foggy_1) while programming some data states to avoid overprogramming and is increased (e.g., to dVpgm_Foggy_2) during programming of other data states that are not as sensitive to overprogramming. This is accomplished by making the programming voltage step size (dVpgm_Foggy) dependent on at least one of the following parameters, each of which is discussed in further detail below: DVCG_FOG_Sn, a fine verify level gap, and a fine programming voltage step size (dVpgm_Fine). As discussed in further detail below, these performance improvements to reduce programming time tProg are achieved with no or de minimis increase in threshold voltage margin.

DVCG_FOG_Sn is the gap between the verify level at the second (fine) programming pass (Vvn) and the verify level at the first (foggy) programming pass (Vvn_Foggy) for any given programmed data state Sn. In other words, for any given data state, DVCG_FOG_Sn=Vvn_Foggy−Vvn. Thus, the greater the DVCG_FOG_Sn for a given data state, the more programming must occur during the second (fine) programming pass. For data states with a larger DVCG_FOG_Sn, a larger dVpgm_Foggy can be used to improve performance without increasing the resulting threshold voltage margin following the second (fine) programming pass and with minimal risk of overprogramming. Likewise, for data states with a smaller DVCG_FOG_Sn, a smaller dVpgm_Foggy should be employed or there is a risk that the threshold voltage window will be negatively impacted or overprogramming could occur.

The fine level verify gap is the difference between the verify voltages of adjacent data states during the second (fine) programming pass, i.e., fine level verify gap for data state Sn=Vvn−Vvn−1. Because the higher data states may experience a greater margin degradation rate than the lower data states, the fine level verify gap may be higher at the higher data states than at the lower data states, e.g., Vv15−Vv14>Vv2−Vv1.

Figure 18:
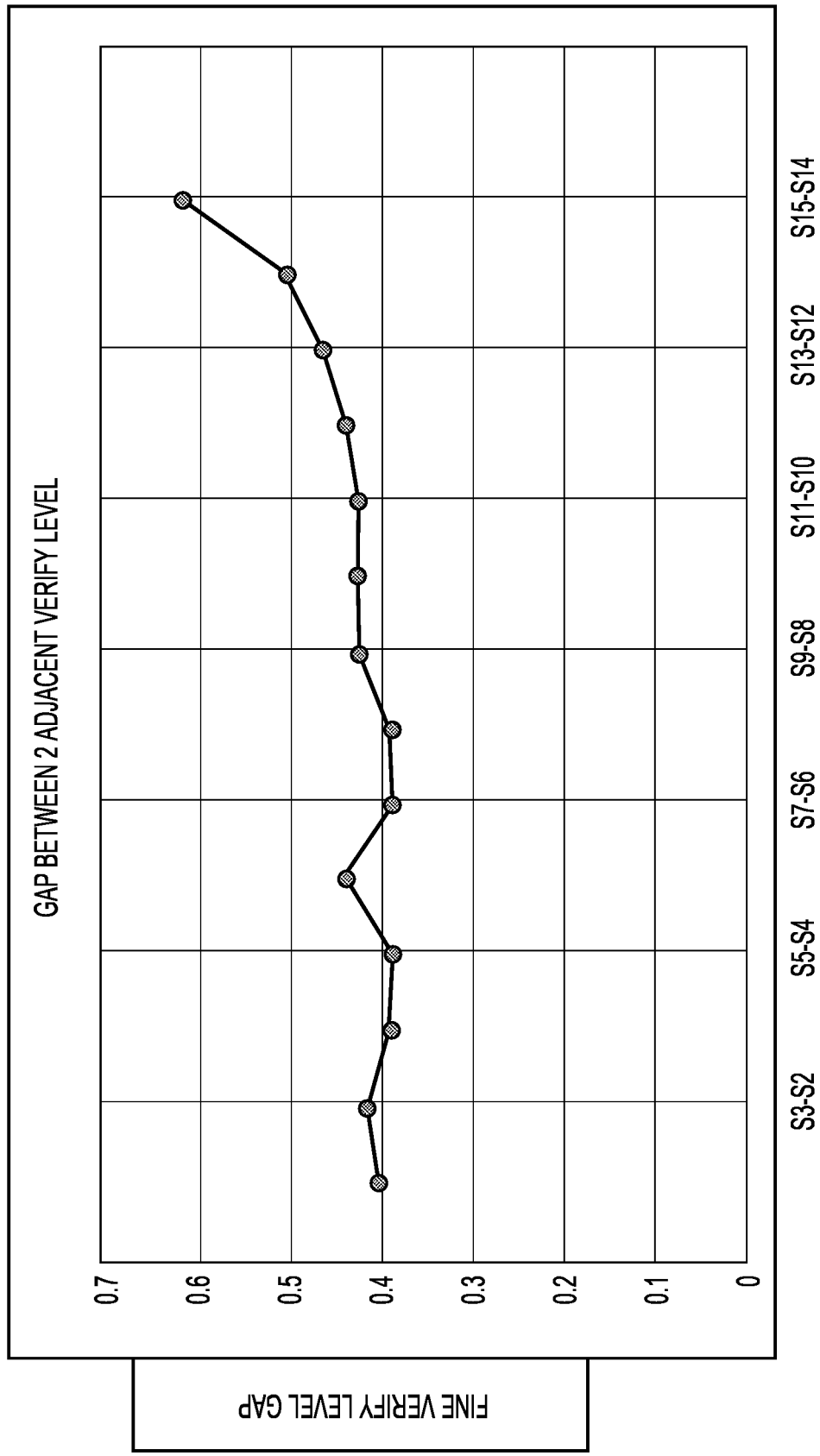
FIG. 18 depicts a fine verify level gap between adjacent data states in a memory device according to an exemplary embodiment of the subject disclosure.

In the embodiment of FIGS. 18 and 19, the fine verify level gaps across data states S1-S15 according to an exemplary embodiment. As shown, the fine verify level gap increases significantly from about data state S12 to data state S15. For data states with a larger fine level verify gap, a larger dVpgm_Foggy may be employed during the first (foggy) programming pass, and for data states with a lesser fine level verify gap, a smaller dVpgm_Foggy may be employed during the first (foggy) programming pass. In this embodiment, a first step size (dVpgm_Foggy_1) is employed during programming loops 1-12, i.e., until verify of the S10 data state is completed. For programming loops 13+, a second step size (dVpgm_Foggy_2) is employed with dVpgm_Foggy_2 being greater than dVpgm_Foggy_1. In other words, in this example, the step size is increased following the completion of programming of the S10 data state. In one exemplary embodiment, dVpgm_Foggy_1 is approximately 0.4 V, and dVpgm_Foggy_2 is 0.55 V, i.e., dVpgm_Foggy_2 is approximately 0.15 V greater than dVpgm_Foggy_1. In some embodiments, the change in step size could occur at a different point during the programming pass or there may be more than one change in step size, and the magnitudes of dVpgm_Foggy could be different than those of this example embodiment.

In another exemplary embodiment where only the S4, S6, and S12 data states are programmed during the first (foggy) programming pass (see FIG. 12), the step size may increase from dVpgm_Foggy_1 to dVpgm_Foggy_2 after programming of data state S6 is completed. In other words, in this embodiment, the step size is dVpgm_Foggy_1 during programming of the S4 and S6 data states, and the step size is dVpgm_Foggy_2 during programming of the S12 data state.

Further, dVpgm_Foggy may be dependent on the programming pulse step size employed during the second (fine) programming pass, i.e., dVpgm_Fine. A larger dVpgm_Fine has been shown to allow for a larger dVpgm_Foggy to be employed without negatively impacting the threshold voltage window. Conversely, a smaller dVpgm_Foggy should be employed if the dVpgm_Fine is smaller. If dVpgm_Fine is data state dependent, then dVpgm_Foggy may also be data state dependent.

In order to avoid overprogramming, it is important to ensure that the upper tail (UT) of the threshold voltage distribution for any given data state Sn after the first (foggy) programming pass is less than the desired upper tail (UT) after the second (fine) programming pass, i.e., Sn_Foggy_UT<Sn_Fine UT.

Figure 20:
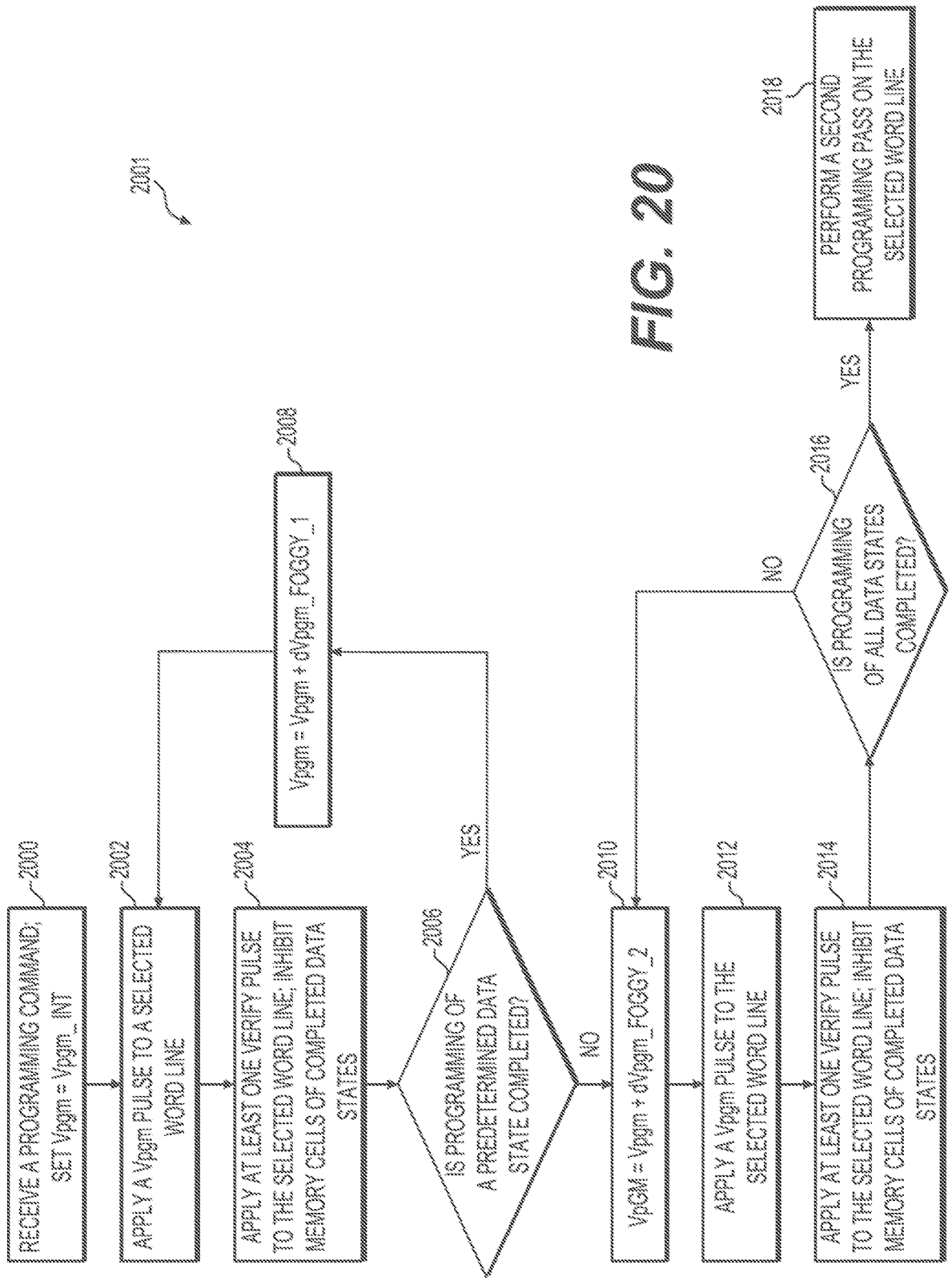
FIG. 20 is a flow chart depicting a programming operation according to an exemplary embodiment of the present disclosure.

Another aspect of the present disclosure is related a method of programming a memory device, such as the memory device discussed above. With reference to the flow chart 2001 of FIG. 20, the method includes the step 2000 of receiving a programming command and setting a programming pulse voltage Vpgm to an initial value, i.e., Vpgm=Vpgm_Int. The method proceeds with performing a first programming pass on a selected word line. The first programming pass includes a plurality of programming loops. The programming loops include the application of a programming (Vpgm) pulse (step 2002) followed by at least one verify pulse (step 2004) to the control gate of the selected word line. Also at step 2004, the memory cells of completed data states are inhibited from further programming. In some embodiments, the at least one verify pulse can be skipped during programming of one or more data states.

At decision step 2006, it is determined if the programming of a predetermined data state is completed. The predetermined data state is a data state which is determined based on at least one of DVCG_FOG_Sn, a fine verify level gap, and a fine programming voltage step size (dVpgm_Fine). If the answer at decision step 2006 is no, then at step 2008, the programming voltage Vpgm is incrementally increased by a first step size, i.e., Vpgm=Vpgm+dVpgm_Foggy_1. The method returns to step 2002.

If the answer at decision step 2006 is no, then at step 2010, the programming voltage Vpgm is incrementally increased by a second step size that is different (preferably greater) than the first step size, i.e., Vpgm=Vpgm+dVpgm_Foggy_2.

At step 2012, a programming pulse Vpgm is applied to the control gate of a selected word line. At step 2014, at least one verify pulse is applied to the control gate of the selected word line, and the memory cells of completed data states are inhibited from further programming.

At decision step 2016, it is determined if programming of all data states is completed. If the answer at decision step 2016 is yes, then at step 2018, a second (fine) programming pass is performed on the selected word line. If the answer at decision step 2016 is no, then the method returns to step 2010.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A storage device, comprising:
a non-volatile memory including control circuitry that is communicatively coupled to an array of memory cells that are arranged in a plurality of word lines and that are configured to be programmed to a plurality of data states, wherein the control circuitry is configured to:
perform a first programming pass on a selected word line of the plurality of word lines, the first programming pass including a plurality of programming loops, each programming loop including application of a programming pulse (Vpgm) to a control gate of the selected word line;
determine step sizes corresponding to increases in a voltage of the programming pulse (Vpgm), wherein the step sizes are determined based on one of (i) a first difference between respective pass verify levels of the first programming pass and a second programming pass and (ii) a second difference between respective pass verify levels of adjacent data states during the second programming pass;

increase a voltage of the programming pulse (Vpgm) between adjacent programming loops of the first programming pass by the step sizes, wherein the step sizes include a first step size between first adjacent programming loops of the first programming pass and a second step size that is different than the first step size between second adjacent programming loops of the first programming pass, wherein increasing the voltage includes determining whether programming of a predetermined data state is completed and, (i) in response to determining that programming of the predetermined data state is not completed, increasing the voltage by the first step size, and (ii) in response to determining that programming of the predetermined data state is completed, increasing the voltage by the second step size; and perform the second programming pass on the selected word line to further program the memory cells of the selected word line to the plurality of data states.

2. The storage device as set forth in claim 1 wherein the step sizes are determined based on at least one data state that is to be programmed during the subsequent programming loop.

3. The storage device as set forth in claim 2 wherein the first step size is used prior to the completion of programming of a threshold data state of the plurality of data states and the second step size is used after the completion of programming of the threshold data state.

4. The storage device as set forth in claim 1 wherein the plurality of data states includes fifteen programmed data states.

5. The storage device as set forth in claim 4 wherein during the first programming pass, verify is conducted during some of the programming loops and verify is skipped during some of the programming loops.

6. The storage device as set forth in claim 1 wherein the step sizes are determined based on which data state of the plurality of data states is to be programmed during the subsequent programming loop and wherein the step size is determined as a function of a gap between a verify level of the data state being programmed during the subsequent programming loop and a second pass verify level of the same data state to be applied during the second programming pass.

7. The storage device as set forth in claim 1 wherein the step sizes are determined based on which data state of the plurality of data states is to be programmed during the subsequent programming loop and wherein the step size is determined as a function of a fine verify level gap for the data state to be programmed during the subsequent programming loop.

8. The storage device as set forth in claim 1 wherein the step sizes are determined based on which data state of the plurality of data states is to be programmed during the subsequent programming loop and wherein the step size is determined as a function of a programming voltage step size that is employed during the second programming pass.

9. A method of programming a memory device, comprising the steps of:

preparing a memory device that includes an array of memory cells arranged in a plurality of words lines, the memory cells being configured to be programmed to a plurality of data states;

performing a first programming pass on a selected word line of the plurality of word lines, the first programming pass including a plurality of programming loops, each programming loop including application of a programming pulse (Vpgm) to a control gate of the selected word line;

determining step sizes corresponding to increases in a voltage of the programming pulse (Vpgm), wherein the step sizes are determined based on one of (i) a first difference between respective pass verify levels of the first programming pass and a second programming pass and (ii) a second difference between respective pass verify levels of adjacent data states during the second programming pass;

increasing a voltage of the programming pulse (Vpgm) between adjacent programming loops of the first programming pass by the step sizes, wherein the step sizes include a first step size between first adjacent programming loops of the first programming pass and a second step size that is different than the first step size between second adjacent programming loops of the first programming pass, wherein increasing the voltage includes determining whether programming of a predetermined data state is completed and, (i) in response to determining that programming of the predetermined data state is not completed, increasing the voltage by the first step size, and (ii) in response to determining that programming of the predetermined data state is completed, increasing the voltage by the second step size; and performing the second programming pass on the selected word line to further program the memory cells of the selected word line to the plurality of data states.

10. The method as set forth in claim 9 wherein the step sizes are determined based on at least one data state that is to be programmed during the subsequent programming loop.

11. The method as set forth in claim 10 wherein the first step size is used prior to the completion of programming of a threshold data state of the plurality of data states and the second step size is used after the completion of programming of the threshold data state.

12. The method as set forth in claim 9 wherein the plurality of data states includes fifteen programmed data states.

13. The method as set forth in claim 9 wherein during the first programming pass, verify is conducted during some of the programming loops and verify is skipped during some of the programming loops.

14. The method as set forth in claim 9 wherein the step sizes are determined based on which data state of the plurality of data states is to be programmed during the subsequent programming loop and wherein the step size is determined as a function of a gap between a verify level of the data state being programmed during the subsequent programming loop and a second pass verify level of the same data state to be applied during the second programming pass.

15. The method as set forth in claim 9 wherein the step sizes are determined based on which data state of the plurality of data states is to be programmed during the subsequent programming loop and wherein the step size is determined as a function of a fine verify level gap for the data state to be programmed during the subsequent programming loop.

16. The method as set forth in claim 9 wherein the step sizes are determined based on which data state of the plurality of data states is to be programmed during the subsequent programming loop and wherein the step size is determined as a function of a programming voltage step size that is employed during the second programming pass.

17. An apparatus, comprising:
a memory device including an array of memory cells that are arranged in a plurality of word lines and a programming means that is in electrical communication with the array of memory cells for programming the memory cells to a plurality of data states, the programming means being configured to:
perform a first programming pass on a selected word line of the plurality of word lines, the first programming pass including a plurality of programming loops, each programming loop including application of a programming pulse (Vpgm) to a control gate of the selected word line;
determine step sizes corresponding to increases in a voltage of the programming pulse (Vpgm), wherein the step sizes are determined based on one of (i) a first difference between respective pass verify levels of the first programming pass and a second programming pass and (ii) a second difference between respective pass verify levels of adjacent data states during the second programming pass;
increase a voltage of the programming pulse (Vpgm) between adjacent programming loops of the first programming pass by the step sizes, wherein the step sizes include a first step size between first adjacent programming loops of the first programming pass and a second step size that is different than the first step size between second adjacent programming loops of the first programming pass, wherein increasing the voltage includes determining whether programming of a predetermined data state is completed and, (i) in response to determining that programming of the predetermined data state is not completed, increasing the voltage by the first step size, and (ii) in response to determining that programming of the predetermined data state is completed, increasing the voltage by the second step size; and
perform the second programming pass on the selected word line to further program the memory cells of the selected word line to the plurality of data states.

18. The apparatus as set forth in claim 17 wherein the step sizes are determined based on at least one data state that is to be programmed during the subsequent programming loop.

19. The apparatus as set forth in claim 18 wherein the first step size is used prior to the completion of programming of a threshold data state of the plurality of data states and the second step size is used after the completion of programming of the threshold data state.

20. The apparatus as set forth in claim 17 wherein the plurality of data states includes fifteen programmed data states.

* * * * *